(12) United States Patent
Kim et al.

(10) Patent No.: US 11,367,768 B2
(45) Date of Patent: Jun. 21, 2022

(54) DISPLAY DEVICE

(71) Applicant: SAMSUNG DISPLAY CO., LTD., Yongin-si (KR)

(72) Inventors: Kwang Hyeok Kim, Yongin-si (KR); Sang Hyun Jun, Yongin-si (KR); Mi Young Kim, Yongin-si (KR); So Yeon Park, Yongin-si (KR); Yong Hwan Park, Yongin-si (KR); Sug Woo Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/216,918

(22) Filed: Mar. 30, 2021

(65) Prior Publication Data
US 2022/0109038 A1  Apr. 7, 2022

(30) Foreign Application Priority Data
Oct. 6, 2020  (KR) ................ 10-2020-0129016

(51) Int. Cl.
| | |
|---|---|
| *H01L 27/32* | (2006.01) |
| *G06F 3/041* | (2006.01) |
| *G06F 3/044* | (2006.01) |
| *G09G 5/10* | (2006.01) |
| *H01L 31/0368* | (2006.01) |
| *H01L 31/0272* | (2006.01) |
| *H01L 31/0296* | (2006.01) |

(52) U.S. Cl.
CPC .......... *H01L 27/3269* (2013.01); *G06F 3/044* (2013.01); *G06F 3/0416* (2013.01); *G09G 5/10* (2013.01); *H01L 27/323* (2013.01); *H01L 27/3216* (2013.01); *G09G 2320/0626* (2013.01); *G09G 2360/144* (2013.01); *H01L 31/0272* (2013.01); *H01L 31/0296* (2013.01); *H01L 31/03682* (2013.01)

(58) Field of Classification Search
CPC ............. H01L 27/3269; H01L 27/3216; H01L 27/323; H01L 31/03682; H01L 31/0296; H01L 31/0272; G06F 3/0416; G06F 3/044; G09G 2320/0626; G09G 2360/144
See application file for complete search history.

(56) References Cited

U.S. PATENT DOCUMENTS

| | | | | |
|---|---|---|---|---|
| 2006/0119590 | A1* | 6/2006 | Park | G06F 3/0412 345/175 |
| 2016/0307542 | A1* | 10/2016 | Zheng | G09G 5/10 |
| 2019/0163313 | A1* | 5/2019 | Kim | G06F 3/0412 |
| 2021/0357057 | A1 | 11/2021 | Kim et al. | |
| 2022/0004731 | A1* | 1/2022 | Li | G06F 3/0446 |

FOREIGN PATENT DOCUMENTS

KR  10-2021-0142036  11/2021

* cited by examiner

*Primary Examiner* — Ryan A Lubit
(74) *Attorney, Agent, or Firm* — F. Chau & Associates, LLC

(57) ABSTRACT

A display device according to an embodiment of the present disclosure includes a display panel including a display region and a non-display region, and a sensor unit which is disposed on the display panel and includes a sensing region and a non-sensing region. The sensor unit includes a touch sensor unit which detects a touch input in the sensing region and a photo sensor unit which detects ambient illuminance.

20 Claims, 27 Drawing Sheets

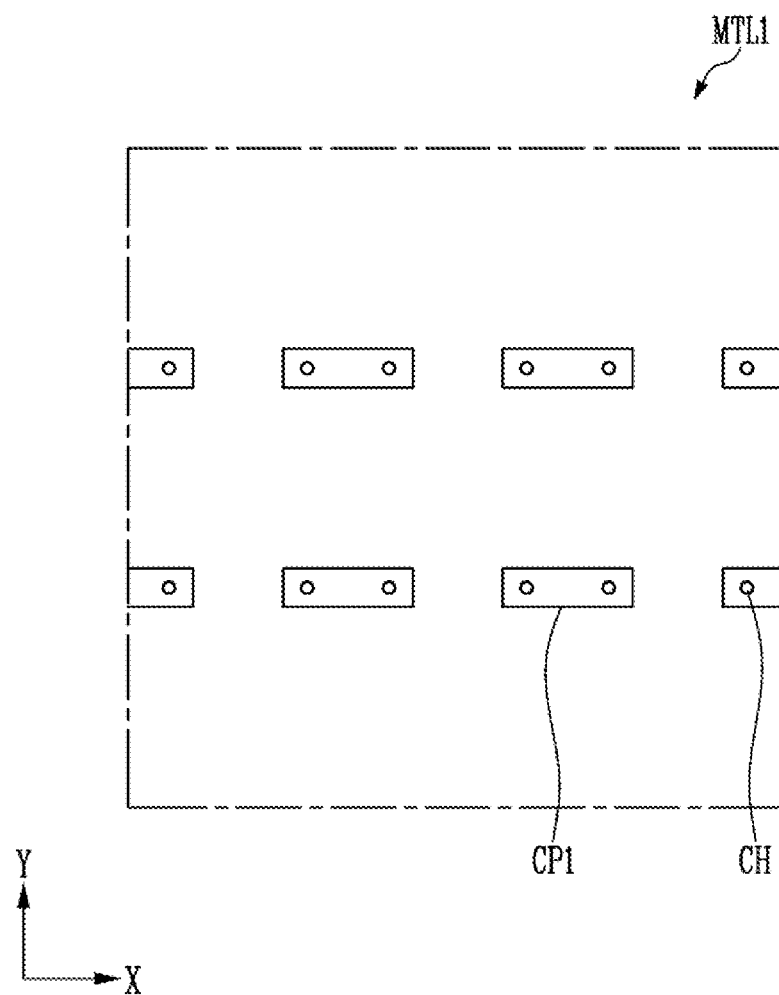

DISPLAY DEVICE

CROSS-REFERENCE

This application claims priority under 35 U.S.C. § 119 to Korean Patent Application No. 10-2020-0129016, filed on Oct. 6, 2020, the entire content of which is herein incorporated by reference.

FIELD

The present disclosure relates to display devices, and more particularly, to a display device including a photo sensor in a touch panel.

DISCUSSION OF RELATED ART

Electronic devices such as smart phones, digital cameras, notebook computers, navigation systems, and smart televisions that provide images to users may include display devices for displaying the images. The display devices may include a display panel for generating and displaying an image, and various input devices.

Touch sensors for recognizing a touch input are widely applied to display devices that are used mainly for smartphones or tablet personal computers (PCs). The touch sensors are gradually replacing keypads, which are existing physical input devices, due to the convenience of a touch screen.

SUMMARY

Display devices may use photosensors to increase display luminance when ambient illuminance is high, and to decrease display luminance when ambient illuminance is low. Visibility may be increased and/or power consumption may be reduced. Although a photo sensor may be disposed in a bezel area of a display device, minimizing a dead space of the display device may be supported by disposing the photo sensor in a region other than the bezel area.

An embodiment of the present disclosure provides a display device in which a photo sensor is disposed in an active region, such as a sensing region, of a touch sensor unit.

Embodiments of the present disclosure are not limited to those described herein, and other embodiments that are not described may be clearly understood by those of ordinary skill in the pertinent art based on the following description.

An embodiment of the present disclosure provides a display device that includes a display panel including a display region and a non-display region, and a sensor unit which is disposed on the display panel and includes a sensing region and a non-sensing region. The sensor unit includes a touch sensor unit which detects a touch input in the sensing region and a photo sensor unit which detects ambient illuminance.

An embodiment of the present disclosure provides a display device, including a display panel including a display region and a non-display region; and a sensor unit which is disposed on the display panel and includes a sensing region and a non-sensing region, wherein the sensor unit includes a touch sensor unit which includes a plurality of touch electrodes and a photo sensor unit which includes a plurality of photo electrodes, and the touch electrodes are arranged in a matrix form in the sensing region, and the photo electrodes are disposed between the touch electrodes on a plane.

The photo sensor unit may include a first photo electrode, a second photo electrode, and a semiconductor pattern, and the first photo electrode and the second photo electrode may overlap the semiconductor pattern in a thickness direction.

The semiconductor pattern may include polysilicon or oxide.

An insulating layer may be interposed between the first photo electrode, the second photo electrode, and the semiconductor pattern.

The semiconductor pattern may include a P-type semiconductor region and an N-type semiconductor region, and the first photo electrode may be electrically connected to the P-type semiconductor region through a contact hole in the insulating layer, and the second photo electrode may be electrically connected to a N-type semiconductor region through a contact hole in the insulating layer.

The semiconductor pattern may include N-type semiconductor regions formed at both ends and include a P-type semiconductor region between the N-type semiconductor regions, and each of the first photo electrode and the second photo electrode may be electrically connected to each of the N-type semiconductor regions through a contact hole formed in the insulating layer.

The photo sensor unit may include a photo detector which detects a current flowing between the first photo electrode and the second photo electrode when light is incident on the semiconductor pattern.

A reverse bias voltage may be applied to the second photo electrode, and the first photo electrode may be connected to the photo detector.

The display device may further include a current amplifier between the photo sensor unit and the photo detector.

The touch electrodes, the first photo electrode, and the second photo electrodes may be simultaneously formed of the same material, and the touch electrodes may be insulated from the first photo electrode and the second photo electrode.

The display region may include a light emission region overlapping a light emitting element in a thickness direction and a non-light emission region other than the light emission region, the first photo electrode and the second photo electrode may be formed in a mesh structure including a body portion and a mesh hole, and the body portion of each of the first photo electrode and the second photo electrode may overlap the non-light emission region in the thickness direction.

The semiconductor pattern may overlap the light emission region and the non-light emission region in the thickness direction.

The photo sensor unit may include a first photo electrode, a second photo electrode, and a photoconductor, and the first photo electrode and the second photo electrode may overlap the photoconductor in a thickness direction.

The photoconductor may be formed of any one of cadmium sulfide (CdS), lead sulfide (PdS), selenium (Se), zinc oxide (ZnO), and antimony trisulfide ($Sb_2S_3$).

An insulating layer may be interposed between the first photo electrode and the second photo electrode, and the photoconductor.

The first photo electrode may be electrically connected to one side of the photoconductor through a contact hole in the insulating layer, and the second photo electrode may be electrically connected to the other side of the photoconductor through a contact hole in the insulating layer.

The display region may include a light emission region overlapping a light emitting element in a thickness direction and a non-light emission region other than the light emission region, and the first photo electrode, the second photo electrode, and the photoconductor may be formed in a mesh structure including a body portion and a mesh hole, and the body portion of each of the first photo electrode, the second photo electrode, and the photoconductor may overlap the non-light emission region in the thickness direction.

The touch electrodes, the first photo electrode, and the second photo electrodes may be simultaneously formed of the same material, and the touch electrodes may be insulated from the first photo electrode and the second photo electrode.

The display panel may control luminance by controlling the number of periods in which pixels are turned off by a light emission control signal during one frame.

The display panel may include a panel driver, the sensor unit may include a controller, and the panel driver may supply a control signal to the controller to detect a current generated from the photo sensor unit exclusively during a period overlapping a period in which the pixels of the display panel are turned off.

According to an embodiment of the present disclosure, a display device may include a photo sensor unit formed by using a dummy touch electrode and a semiconductor pattern in a sensing region of a touch sensor unit.

Embodiments are not limited by the content exemplified above. Other embodiments and variations thereof are included in the present specification.

BRIEF DESCRIPTION OF THE DRAWINGS

FIGS. 15A and 15B are schematic diagrams showing plan views respectively illustrating a first metal layer and a second metal layer of a sensor unit according to an embodiment of the present disclosure.

DETAILED DESCRIPTION

Figure 1:
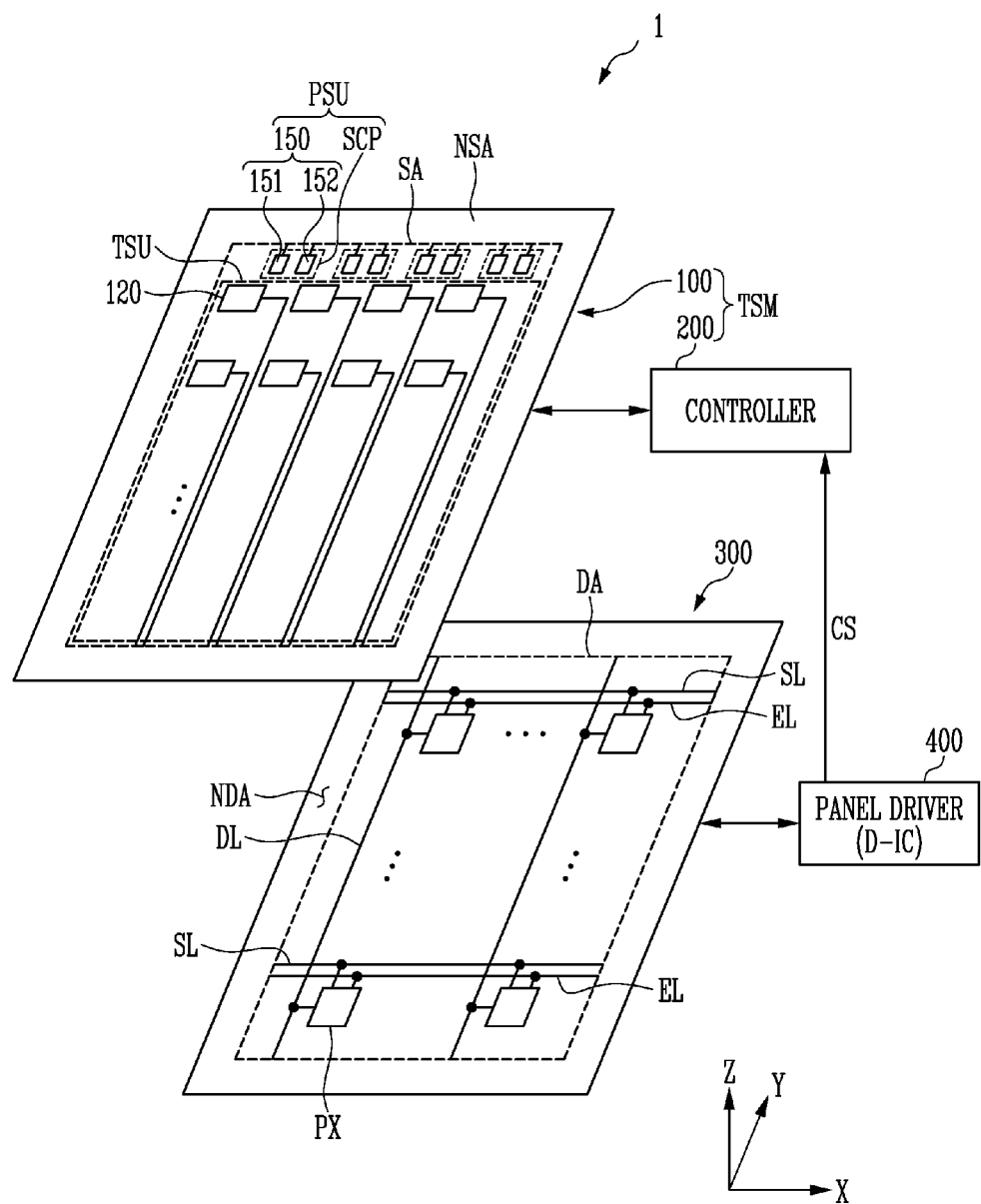
FIG. 1 is a schematic hybrid diagram that illustrates a display device according to an embodiment.

Embodiments of the present disclosure, including a device and a method of operation, will become more apparent from the description that follows when considered together with the accompanying drawings. However, the present disclosure is not limited to the embodiments to be disclosed below and may be implemented in a variety of different forms. The described embodiments make the present disclosure complete and are provided to illustrate the general scope of the present disclosure to those skilled in the art to which the present disclosure belongs, where the inventive concept is defined by the scope of the claims.

When an element or layer is referred to as "on" different elements or elements in different layers, this includes all cases in which another layer or another element is interposed therebetween either directly on or in the middle of another element.

It goes without saying that, although first, second, third, fourth, and the like are used to describe various configuration elements, the configuration elements are not limited by the terms. The terms are merely used to distinguish one configuration element from another configuration element. Therefore the first configuration element to be described below may be any one of the second configuration element, the third configuration element, and the fourth configuration element within the technical idea of the present disclosure.

Embodiments described in the present specification may be described with reference to a plan view and a cross-sectional view, which are ideal schematic views of the present disclosure. Therefore, the shape of the example diagram may be modified by manufacturing technology and/or tolerances. Therefore, embodiments of the present disclosure are not limited to the specific form illustrated, but also include a change in form generated according to the manufacturing process. Therefore, regions illustrated in the drawings have schematic properties, and the shapes of regions illustrated in the drawings are for exemplifying specific shapes of the regions of elements and are not intended to limit the scope of the disclosure.

Hereinafter, embodiments will be described with reference to the accompanying drawings.

Figure 2:
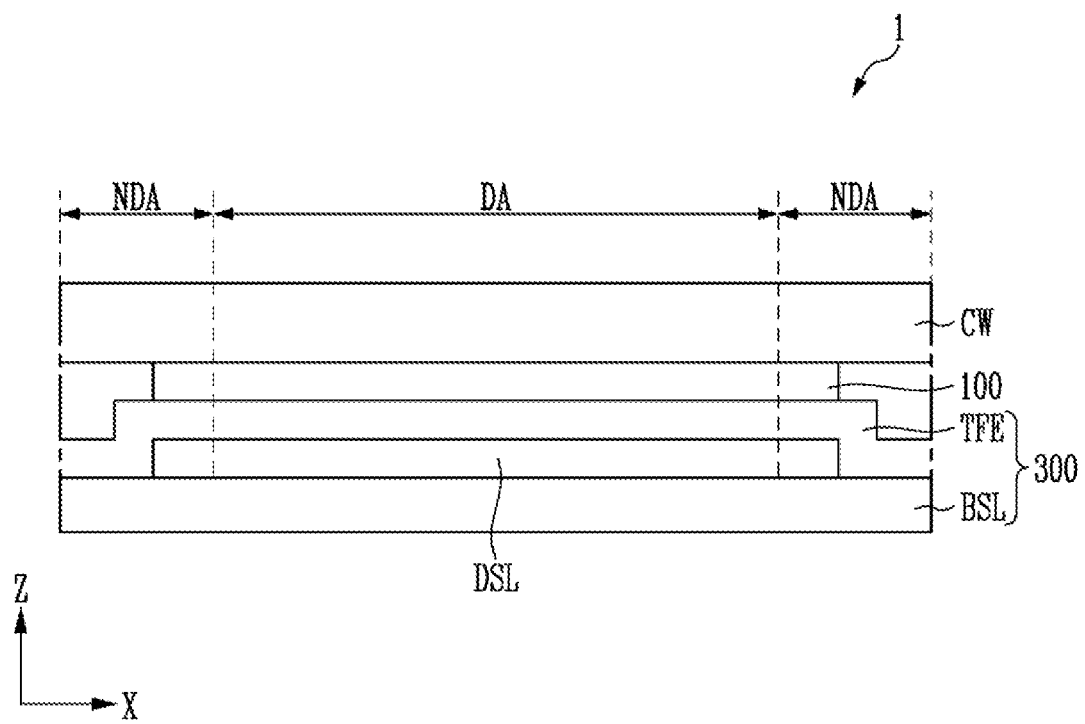
FIG. 2 is a schematic partial cross-sectional diagram of the display device illustrated in FIG. 1.

FIG. 1 schematically illustrates a display device according to an embodiment. FIG. 2 illustrates schematic partial cross-sectional view of the display device illustrated in FIG.

Figure 3:
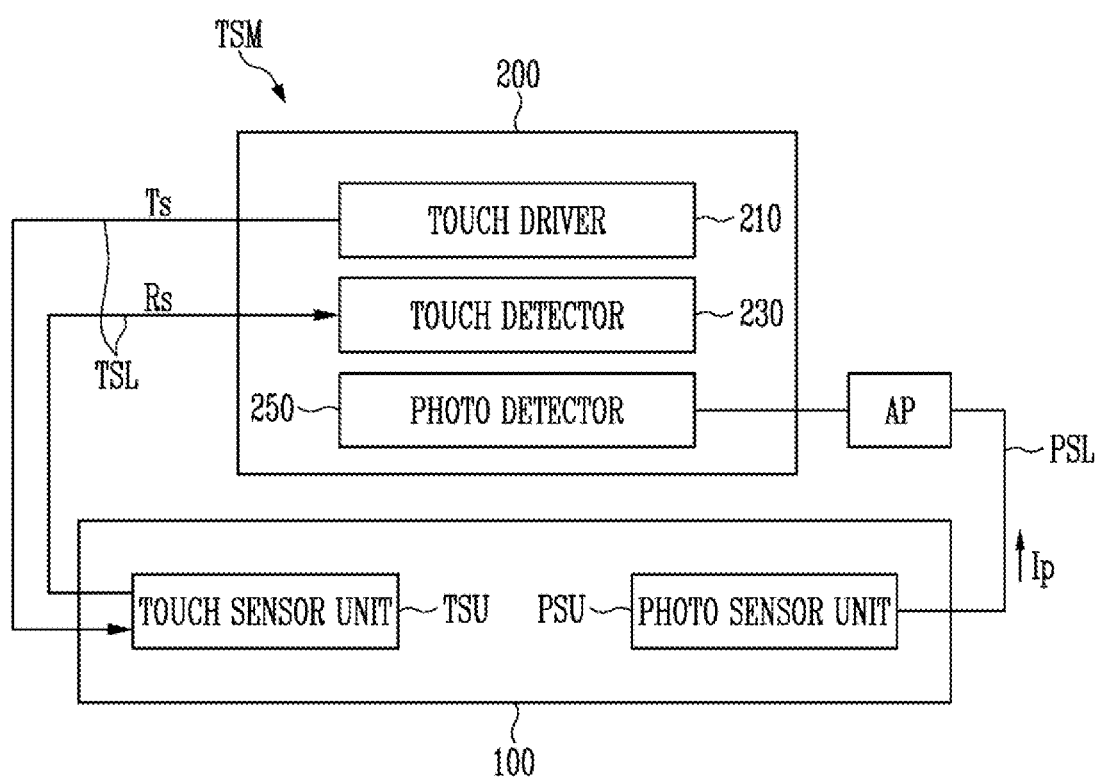
FIG. 3 is a block diagram of a touch sensor illustrated in FIG. 1.
Figure 4:
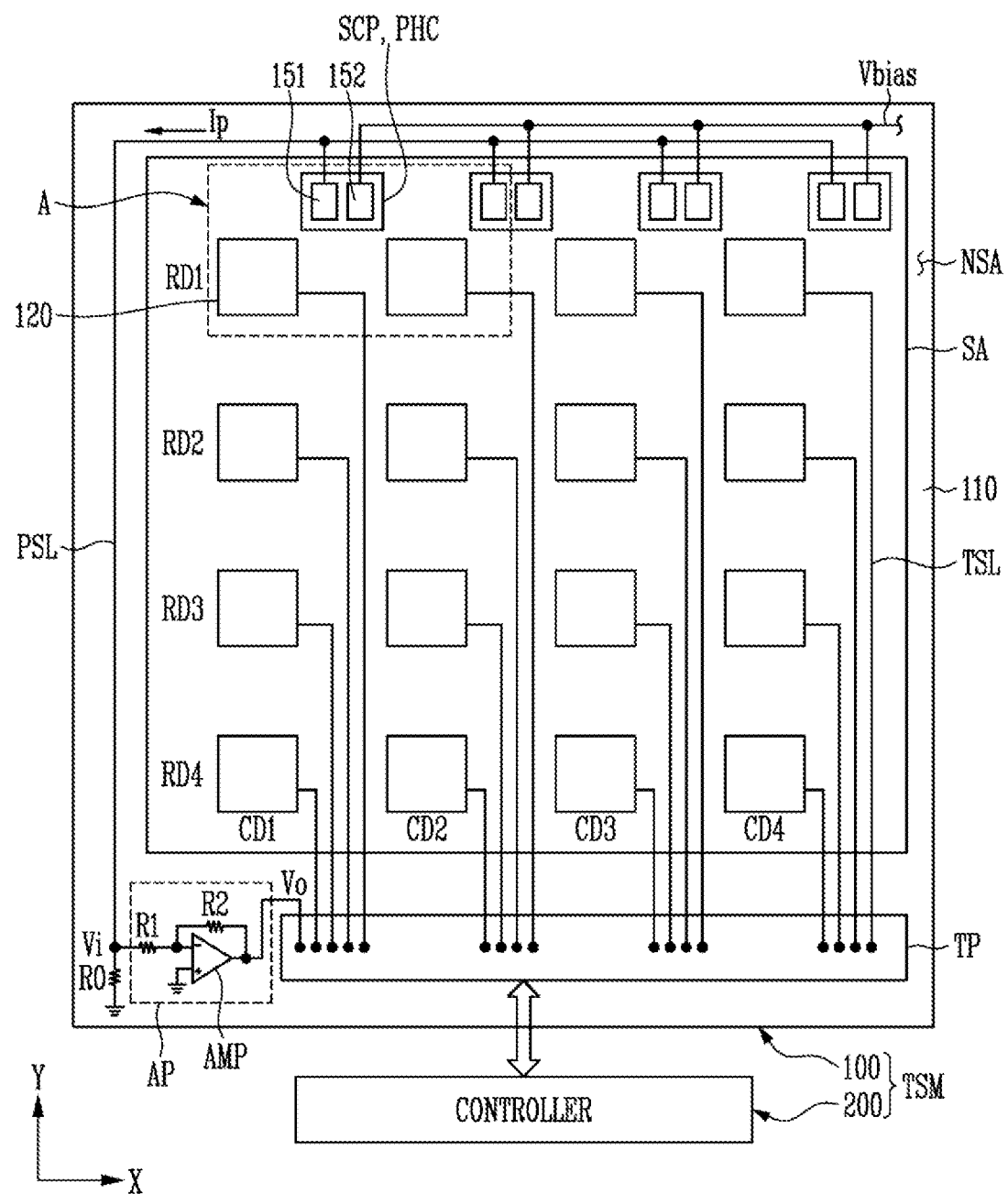
FIG. 4 is a schematic hybrid diagram showing a plan view of a touch sensor according to an embodiment.

1. FIG. 3 illustrates a touch sensor illustrated in FIG. 1. FIG. 4 illustrates a plan view of a touch sensor according to an embodiment.

In the present specification, "upper portion", "top", and "upper surface" may indicate an upper direction, that is, the Z-axis direction with respect to a display panel (DP), and "lower portion", "bottom", and "lower surface" may indicate a lower direction, that is, a direction opposite to the Z-axis direction with respect to the DP. In addition, "left", "right", "inward", and "outward" may indicate directions when viewing the display panel DP from a plane. For example, "left" may indicate a direction opposite to the X-axis direction, "right" may indicate the X-axis direction, "inward" may indicate the Y-axis direction such as into the page, and "outward" may indicate a direction opposite to the Y-axis direction such as out of the page.

Referring to FIGS. 1 to 4, a display device 1 according to an embodiment may include a touch sensor TSM, a display panel 300, and a panel driver 400.

According to an embodiment, the touch sensor TSM may include a sensor unit 100 and a controller 200. FIG. 1 illustrates that the sensor unit 100 and the display panel 300 are separated from each other for the sake of convenient description, but the present disclosure is not limited thereto. For example, the sensor unit 100 and the display panel 300 may also be integrally formed.

The display panel 300 includes a display region DA and a non-display region NDA surrounding at least some of the display region DA.

The display panel 300 may include a base substrate BSL, an element layer DSL located on the base substrate BSL, and a thin film encapsulation layer TFE located on the element layer DSL.

The base substrate BSL supports the element layer DSL. In some embodiments, the base substrate BSL may be an insulating substrate formed of glass, quartz, ceramic, or plastic.

The element layer DSL may be located on the base substrate BSL. In some embodiments, the element layer DSL may include a plurality of pixels PX and a plurality of display signal lines located on the base substrate BSL. Each pixel PX may include a thin film transistor (TFT), a capacitor, and a light emitting element. The plurality of display signal lines may include scan lines SL for transmitting a scan signal to the respective pixels PX, light emission control lines EL for transmitting a light emission control signal, and data lines DL for transmitting a data signal.

The pixels PX included in the element layer DSL may be located in the display region DA.

The element layer DSL may further include elements and wires or lines located in the non-display region NDA on the base substrate BSL. In addition, the elements and wires or lines may generate various signals applied to the pixels PX or may transmit the signals to the pixels PX.

The thin film encapsulation layer TFE may be located on the element layer DSL. The thin film encapsulation layer TFE may protect the element layer DSL. The thin film encapsulation layer TFE may include a plurality of thin films.

In the present disclosure, the type of the display panel 300 is not limited in particular. For example, the display panel 300 may be a self-luminous display panel such as an organic light emitting diode (OLED) display panel, a quantum dot light emitting diode (QLED) display panel, an inorganic material-based micro light emitting diode display panel, or an inorganic material-based nano light emitting diode display panel. Alternatively, the display panel 300 may be a non-luminous display panel such as a liquid crystal display (LCD) panel, an electro-phoretic display (EPD) panel, or an electro-wetting display (EWD) panel. When the display panel 300 is a non-luminous display panel, the display device may further include a backlight unit for supplying light to the display panel 300. Hereinafter, for the sake of convenient description, a case in which the display panel 300 is an organic light emitting diode display panel will be described as an example.

The panel driver 400 is electrically connected to the display panel 300 to supply a signal required for driving the display panel 300. As an example, the panel driver 400 may include at least one of a scan driver that supplies a scan signal to the scan lines SL, a light emission controller that supplies a light emission control signal to the light emission control lines EL, a data driver that supplies a data signal to the data lines DL, and a timing controller that drives the data driver.

According to an embodiment, the scan driver, the light emission controller, the data driver, and/or the timing controller may be integrated into one display IC (D-IC), and is not limited thereto. For example, in another embodiment, at least one of the scan driver, the light emission controller, the data driver, and/or the timing controller may be integrated or mounted on the display panel 300.

In addition, according to an embodiment, the panel driver 400 may be electrically connected to the controller 200 of the touch sensor TSM to supply a control signal CS for driving the touch sensor TSM.

The sensor unit 100 may be provided on at least one region of the display panel 300. For example, the sensor unit 100 may be provided on at least one surface of the display panel 300 to overlap the display panel 300 in a third direction (Z-axis direction) that is a thickness direction. For example, the sensor unit 100 may be disposed on one surface (for example, an upper surface) on which an image is displayed among both surfaces of the display panel 300. Alternatively, the sensor unit 100 may be directly formed on at least one or both surfaces of the display panel 300, or may be formed inside the display panel 300. For example, the sensor unit 100 may be formed directly on an upper substrate or on a thin film encapsulation layer of the display panel 300, or on an outer surface such as an upper surface of the upper substrate or a lower surface of a lower substrate, and/or may be formed directly on an inner surface, such as a lower surface of the upper substrate or an upper surface of the lower substrate.

The sensor unit 100 includes a sensing region SA capable of sensing a touch input, and a non-sensing region NSA surrounding at least some of the sensing region SA. According to an embodiment, the sensing region SA may be disposed to correspond to the display region DA of the display panel 300, and the non-sensing region NSA may be disposed to correspond to the non-display region NDA of the display panel 300. For example, the sensing region SA of the sensor unit 100 may overlap the display region DA of the display panel 300 in the third direction (e.g., Z-axis direction), and the non-sensing region NSA of the sensor unit 100 may overlap the non-display region NDA of the display panel 300 in the third direction.

According to an embodiment of the present disclosure, the sensor unit 100 may include a touch sensor unit TSU for detecting a touch input and a photo sensor unit PSU for detecting ambient illuminance in the sensing region SA.

The touch sensor unit TSU may include touch electrodes 120. The touch electrodes 120 may be arranged in a matrix pattern. That is, the touch electrodes 120 may be arranged in a first direction (e.g., X-axis direction) and a second direction (e.g., Y-axis direction) that crosses the first direction. For example, the first direction may be perpendicular to the second direction, without limitation thereto. The touch electrodes 120 may have a square shape, but are not limited thereto. In some embodiments, the touch electrodes 120 may have various shapes such as a polygonal shape or a circular shape. In addition, in some embodiments, the touch electrodes 120 may have two or more shapes. For example, some of the touch electrodes 120 may have a square shape, and others of the touch electrodes 120 may have a circular shape. In addition, in some embodiments, the touch electrodes 120 may have different areas. For example, when a hole for inserting a camera or the like thereinto is formed in the display device 1, the touch electrodes 120 around the hole may also have a shape in which some of the touch electrodes are reduced or removed according to a shape of the hole.

The touch electrodes 120 may be arranged in the form of islands spaced apart from each other in the first direction (e.g., X-axis direction) and the second direction (e.g., Y-axis direction) crossing the first direction. The touch electrodes 120 may form an electrode row in the first direction and may form an electrode row in the second direction.

In FIG. 4, for the sake of convenient description, the touch electrodes 120 are arranged in a 4×4 matrix. That is, although it is illustrated that four touch electrodes 120 are sequentially arranged in the order of a first electrode row RD1, a second electrode row RD2, a third electrode row RD3, and a fourth electrode row RD4, and four touch electrodes 120 are sequentially arranged in the first direction (e.g., X-axis direction) in the order of a first electrode row CD1, a second electrode row CD2, a third electrode row CD3, and a fourth electrode row CD4, it shall be understood that these are for the sake of convenient description and are not limited thereto, and that the number and arrangement of the touch electrodes 120 may be variously changed.

The touch electrodes 120 may be electrically connected to the controller 200 and may receive a driving signal Ts for detecting a touch from the controller 200. In addition, the touch electrodes 120 may output a sensing signal Rs for detecting a touch to the controller 200.

The touch electrodes 120 may overlap at least one electrode provided on the display panel 300. For example, when the display panel 300 is an organic light emitting diode display panel, the touch electrodes 120 may overlap a cathode electrode or the like on the display panel 300.

The photo sensor unit PSU may generate a current Ip in response to illuminance by ambient light. Intensity of the current Ip may correspond to the illuminance by ambient light. The current Ip generated by the photo sensor unit PSU may be provided to the photo detector 250.

The photo sensor unit PSU may include photo electrodes 150 and a semiconductor pattern SCP. According to an embodiment, the photo electrodes 150 may be formed by using dummy touch electrodes. That is, the photo electrodes 150 may be simultaneously formed of the same material as the touch electrodes 120. The dummy touch electrodes are electrically insulated from the touch electrodes 120 and may be formed in an empty space, in which the touch electrodes 120 are not formed, in the sensing region SA. The touch electrodes 120, where regularly arranged in a matrix form, may be visually recognized by a user of the display device 1 as a pattern, resulting in non-optimal display quality. Alternatively, the dummy touch electrodes may be arranged between the touch electrodes 120.

For example, the photo electrodes 150 may be formed by using the dummy touch electrodes arranged between the touch electrodes 120 forming the first electrode row RD1. The photo electrodes 150 may include a first photo electrode 151 and a second photo electrode 152. As illustrated in FIG. 4, three sets of the first and second photo electrodes 151 and 152 may be arranged between four touch electrodes 120 that are arranged in the first direction (e.g., X-axis direction). Forming the photo electrodes 150 between the touch electrodes 120 constituting the first electrode row RD1 may be arranged according to a method in which an illuminance sensor is disposed above the display device 1. However, this is an example, and the photo electrodes 150 may be formed anywhere in an empty space between the touch electrodes 120.

The first photo electrode 151 and the second photo electrode 152 may have substantially the same shape as the touch electrodes 120. For example, the first photo electrode 151 and the second photo electrode 152 may have a square shape, but are not limited thereto. That is, the first photo electrode 151 and the second photo electrode 152 may have various shapes such as a polygonal shape and/or a circular shape. In addition, the first photo electrode 151 and the second photo electrode 152 may occupy an area smaller than the touch electrodes 120.

However, this is an example, and the first photo electrode 151 and the second photo electrode 152 may have a shape different from, or substantially the same area as, the touch electrodes 120.

According to an embodiment, the semiconductor pattern SCP may be formed to overlap the photo electrodes 150 in the third direction (e.g., Z-axis direction) that is a thickness direction. The semiconductor pattern SCP may have substantially the same shape as the touch electrodes 120 and the photo electrodes 150. For example, the semiconductor pattern SCP may have a square shape. However, the semiconductor pattern SCP is not limited thereto, and may be formed in various shapes such as a polygonal shape and/or a circular shape. In addition, the semiconductor pattern SCP may have a larger area than the photo electrodes 150. However, this is an example, and the shape and area of the semiconductor pattern SCP may be modified as long as ambient light is absorbed and electrons and holes are excited due to a photoelectric effect to generate a current.

The controller 200 may include a touch driver 210, a touch detector 230, and the photo detector 250; and the controller 200 may be electrically connected to the touch sensor unit TSU through at least one touch wire TSL to supply the driving signal Ts to the touch sensor unit TSU and/or to receive the sensing signal Rs corresponding to the driving signal Ts from the touch sensor unit TSU to detect a touch position. In addition, the controller 200 may be electrically connected to the photo sensor unit PSU through a photo wire PSL to detect the current Ip.

For example, the touch electrodes 120 may form a first capacitance with at least one electrode provided in the display panel 300. When a user's finger comes into contact with at least one of the touch electrodes 120, a second capacitance is generated between the finger and the touch electrode 120, and the first capacitance is changed by the second capacitance. A changed value of the first capacitance is transmitted to the touch detector 230 through the touch line TSL connected to the touch electrode 120 in contact with the finger. The touch detector 230 may detect a touch position by checking the touch line TSL receiving a value of the first capacitance. That is, the touch detector 230 may detect a touch position by detecting a change amount of a self-capacitance formed on the touch electrode 120.

The photo detector 250 may be electrically connected to the photo sensor unit PSU and/or photo electrodes 150, and detect the current Ip flowing between the first and second photo electrodes 151 and 152.

The photo electrodes 150 may be connected to a pad portion TP through the photo wires or lines PSL. According to an embodiment, an amplification circuit AP that amplifies the current Ip may be further included between the photo sensor unit PSU and the photo detector 250. After a reverse bias voltage Vbias is applied to the second photo electrodes 152 through a reverse bias voltage source, when ambient light is incident on the semiconductor pattern SCP and/or a photoconductor PHC, the current Ip may flow from the second photo electrodes 152 to the first photo electrodes 151. However, when the amount of ambient light incident on the semiconductor pattern SCP or the photoconductor PHC is small, the current Ip might not be adequately supplied to the photo detector 250 without amplification. Thus, the amplification circuit AP that amplifies the current Ip may be provided between the photo sensor unit PSU and the photo detector 250.

According to an embodiment, the amplification circuit AP may be an inverting amplification circuit including an operational amplifier AMP, a first resistor R1, and a second resistor R2. The operational amplifier AMP may include an inverting input terminal, a non-inverting input terminal, and an output terminal. An input resistor R0 may be disposed at one end of the photo wire PSL. One end of the input resistor R0 may be connected to the photo wire PSL, and the other end may be connected to a ground voltage. The current Ip supplied from the first photo electrode 151 may generate an input voltage Vi due to the input resistance R0. The first resistor R1 may be disposed between the non-inverting terminal of the operational amplifier AMP and one end of the input resistance R0, and the second resistor R2 may be disposed between the inverting terminal and the output terminal of the operational amplifier AMP, and the non-inverting terminal of the operational amplifier AMP may be connected to the ground voltage. In this case, a voltage gain of the operational amplifier AMP may be −(R2/R1). Thus, an output voltage Vo may have a magnitude obtained by multiplying the input voltage Vi by the voltage gain.

However, the amplification circuit AP is not limited to the above-described configuration, and various other amplification circuits may be applied thereto.

The touch driver 210, the touch detector 230, and the photo detector 250 may be integrated into one touch IC but are not limited thereto; and in some embodiments, the touch driver 210 and the touch detector 230 may be integrated into one touch IC, and the photo detector 250 may be located in a portion other than the inside of the touch IC. For example, the photo detector 250 may be disposed on the display panel 300 or may be disposed on a separate flexible circuit board.

A cover window CW may be disposed on the sensor unit 100. The cover window CW disposed on the display panel 300 may protect the display panel 300 from external impacts. The cover window CW may be formed of a transparent material such as a film of tempered glass or plastic material.

The display device 1 may further include an optical member.

Hereinafter, the touch sensor TSM will be described in more detail with reference to FIGS. 5 to 7.

Figure 5:
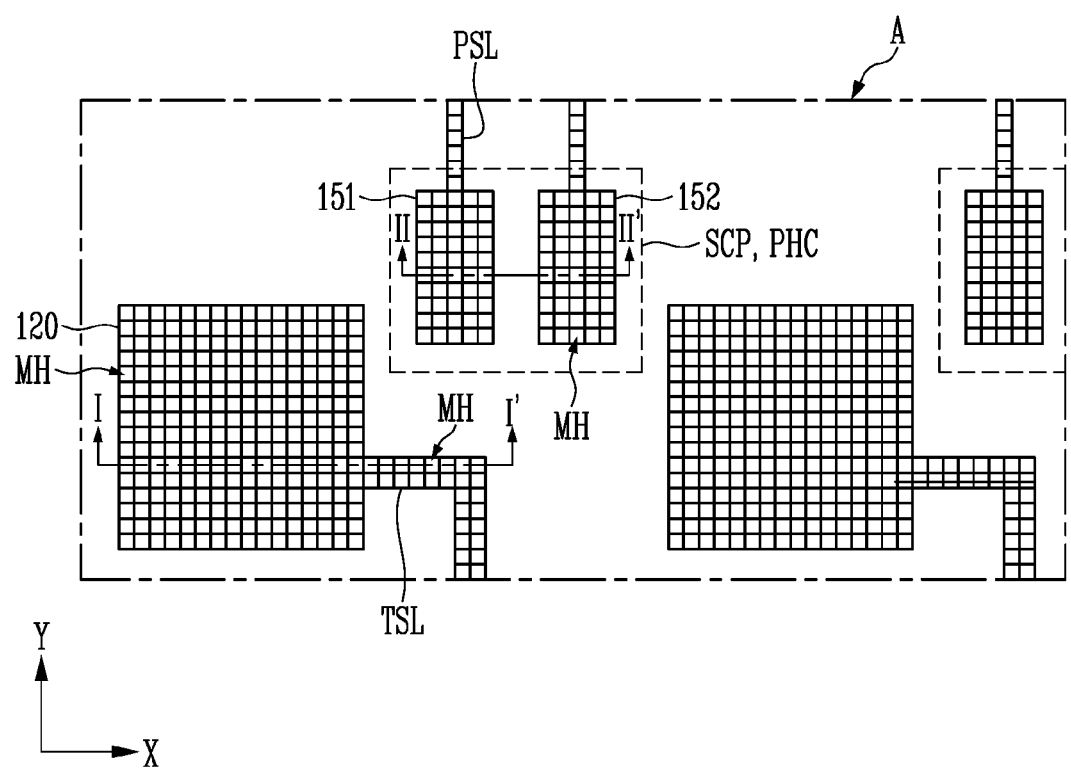
FIG. 5 is a schematic diagram showing an enlarged plan view of a portion A of FIG. 4, according to an embodiment.

FIG. 5 shows an enlarged plan view of a portion A of FIG. 4, according to an embodiment; FIG. 6 shows a cross-sectional view taken along line I-I' of FIG. 5; and FIGS. 7A to 7C show cross-sectional views of a photo sensor unit taken along line II-II' of FIG. 5, according to embodiments.

Figure 6:
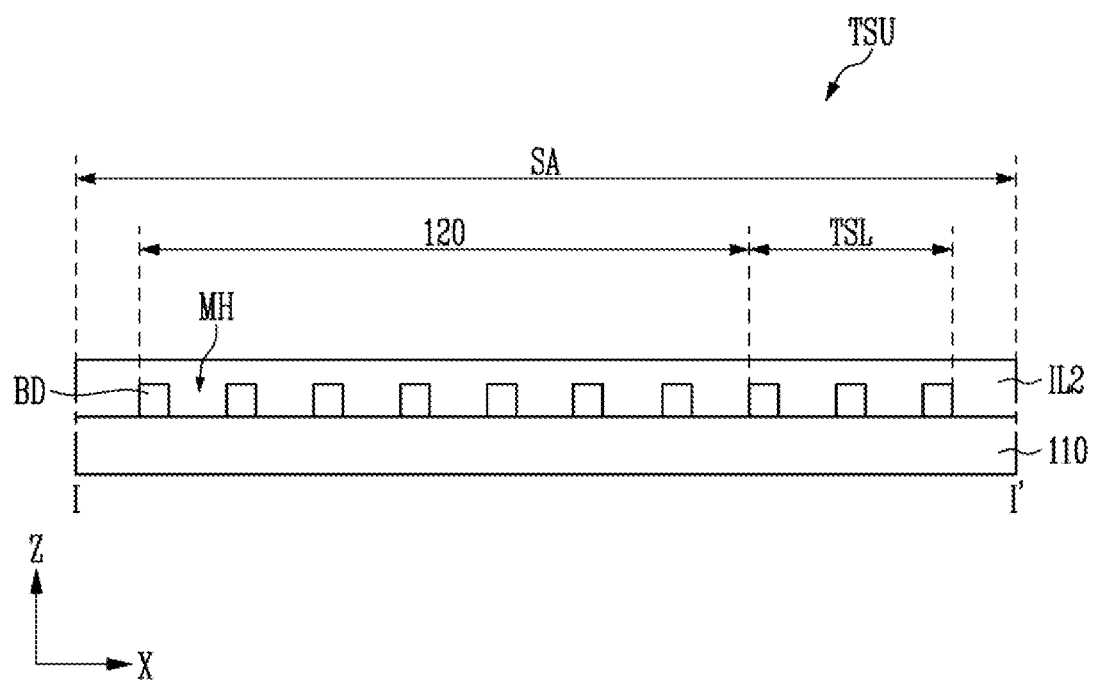
FIG. 6 is a schematic diagram showing a cross-sectional view taken along line I-I' of FIG. 5.
Figure 7A:
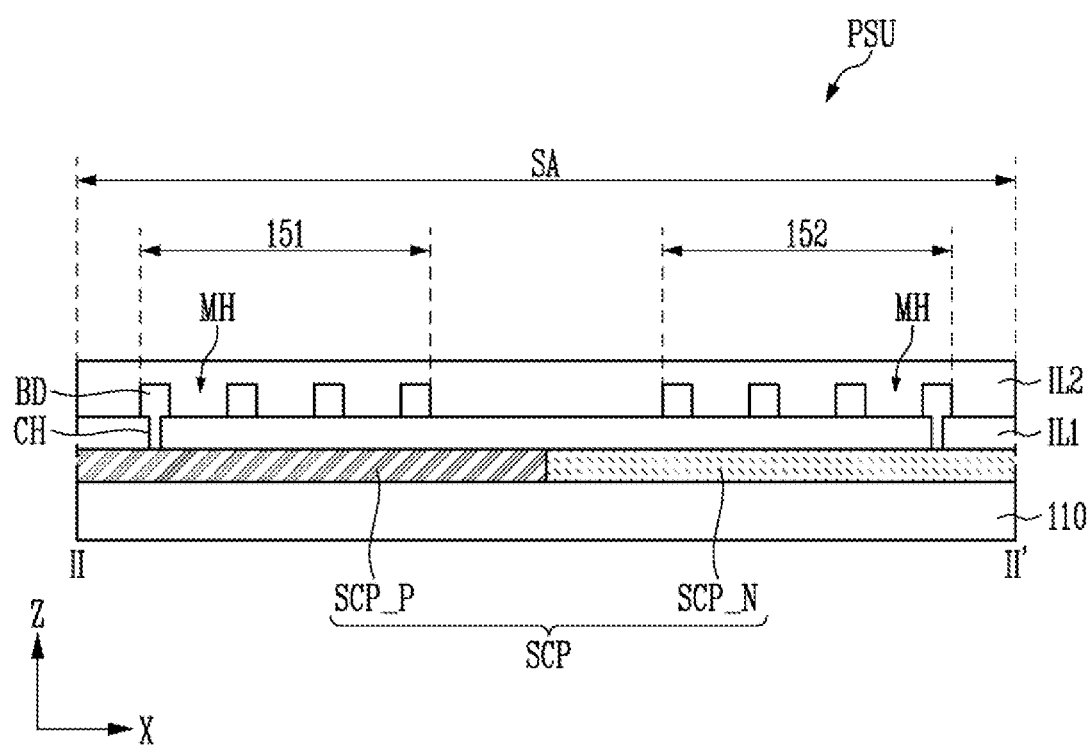
FIGS. 7A to 7C are schematic diagrams showing cross-sectional views of a photo sensor unit taken along line II-II' of FIG. 5, according to various embodiments.
Figure 7B:
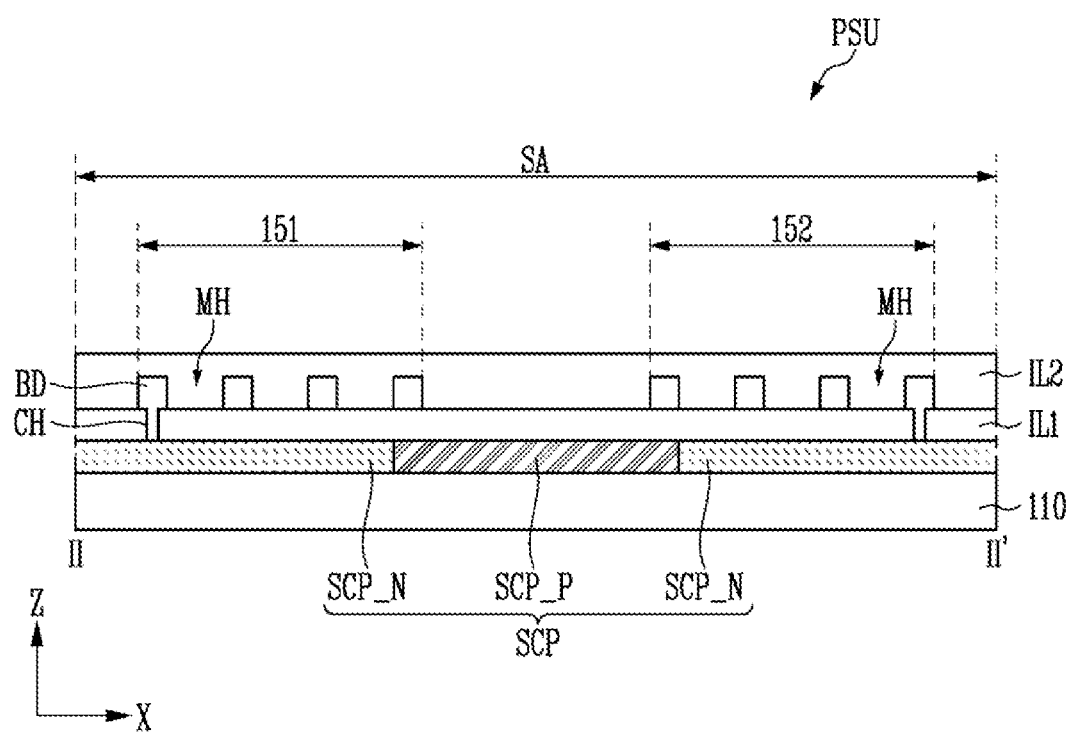
Figure 7C:
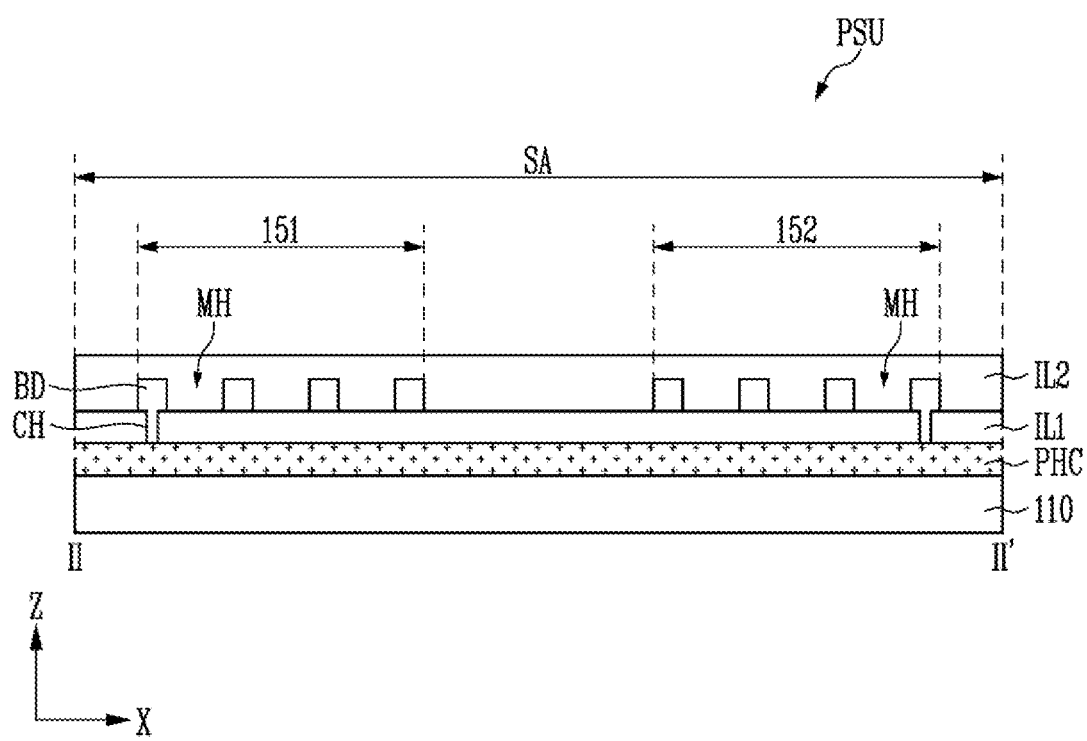

Referring to FIGS. 4, 5, and 6, the touch sensor unit TSU includes the touch electrodes 120 and a second insulation layer IL2 stacked on the base layer 110 or thin film encapsulation layer TFE.

The base layer 110 may include the sensing region SA and the non-sensing region NSA. The base layer 110 serves as a base for the touch electrodes 120, and in some embodiments, the base layer 110 may also be one of the layers constituting the display panel 300. For example, in an embodiment in which the sensor unit 100 and the display panel 300 are integrally formed, the base layer 110 may be at least one layer constituting the display panel 300. For example, the base layer 110 may be or include a thin film encapsulation (TFE) layer of the display panel 300. Alternatively, the base layer 110 may be a rigid substrate or a flexible substrate according to embodiments. For example, the base layer 110 may also be a rigid substrate formed of glass or tempered glass, or a flexible substrate configured by a thin film formed of a flexible plastic material. Hereinafter, a case in which the base layer 110 is configured by at least one layer constituting the display panel 300, for example, a layer including the TFE, will be described as an example.

The touch electrodes 120 arranged in an island shape and the touch wires or lines TSL electrically connected to the touch electrodes 120 may be arranged on the sensing region SA of the base layer 110. The touch electrodes 120 may be connected to the pad portion TP through the touch wires or lines TSL.

Referring to FIGS. 4, 5, and 7A, the photo sensor unit PSU may have the semiconductor pattern SCP, a first insulating layer IL1, the photo electrodes 150, and the second insulating layer IL2 which are sequentially stacked on the base layer 110.

The semiconductor pattern SCP may include polysilicon or oxide. In addition, the semiconductor pattern SCP may have one region which is formed as a P-type semiconductor region SCP_P through an ion doping process, and the other region which is formed as an N-type semiconductor region SCP_N. For example, the semiconductor pattern SCP illustrated in FIG. 7A may be a photodiode having a PN junction structure.

The first insulating layer IL1 may be formed on the semiconductor pattern SCP, and a contact hole CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may be respectively in contact with the P-type semiconductor region SCP_P and the N-type semiconductor region SCP_N through the contact holes CH. In FIG. 7A, each of the first photo electrode 151 and the second photo electrode 152 is in contact with the P-type semiconductor region SCP_P or the N-type semiconductor region SCP_N, respectively, through a respective contact hole CH, but is not limited thereto, and may be in contact through two or more contact holes CH.

According to an embodiment, a reverse voltage may be applied to a photodiode. For example, the reverse bias voltage Vbias may be applied to the second photo electrode 152 electrically connected to the N-type semiconductor region SCP_N through a reverse bias voltage source. When the reverse voltage is applied to the P-type semiconductor region SCP_P and the N-type semiconductor region SCP_N, a current does not flow normally, but when ambient light is incident on the semiconductor pattern SCP, electrons and holes are excited due to a photoelectric effect to generate a reverse current. For example, the current Ip may flow from the second photo electrode 152 to the first photo electrode 151. In this case, intensity of the current Ip may correspond to illuminance by the ambient light. That is, as the illuminance by illuminance by the ambient light increases, a larger current Ip may be generated. The current Ip generated by the photo sensor unit PSU may be provided to the photo detector 250.

FIG. 7A illustrates a photodiode in which the semiconductor pattern SCP has a PN junction structure, but is not limited thereto and may also be a photodiode having a PIN junction structure further including an intrinsic semiconductor region which is a depletion layer between the P-type semiconductor region SCP_P and the N-type semiconductor region SCP_N, for example.

Referring to FIGS. 4, 5, 7A, and 7B, the semiconductor pattern SCP that is illustrated in FIG. 7B includes a photo transistor having an NPN junction structure that is different from the semiconductor pattern SCP that is illustrated in FIG. 7A having a photodiode with a PN structure. However, the semiconductor pattern SCP illustrated in FIG. 7B is an example and may also be applied to a photo transistor having a PNP junction structure, for example.

In the photo sensor unit PSU, the semiconductor pattern SCP, the first insulating layer IL1, the photo electrodes 150, and the second insulating layer IL2 may be sequentially stacked on the base layer 110.

The semiconductor pattern SCP may include polysilicon or oxide. In addition, the semiconductor pattern SCP may be subjected to an ion doping process so that both end regions of the semiconductor pattern SCP are formed as N-type semiconductor regions SCP_N, and a region between the end regions is formed as a P-type semiconductor region SCP_P. The first insulating layer IL1 may be formed on the semiconductor pattern SCP, and the contact hole CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may contact the N-type semiconductor region SCP_N formed in both end regions through the contact hole CH. For the sake of convenient description, hereinafter, the N-type semiconductor region SCP_N connected to the first photo electrode 151 will be referred to as a left N-type semiconductor region SCP_N, and the N-type semiconductor region SCP_N connected to the second photo electrode 152 will be referred to as a right N-type semiconductor region SCP_N, as illustrated in FIG. 7B.

According to an embodiment, a reverse voltage may be applied to a photo transistor. For example, the reverse bias voltage Vbias may be applied to the second photo electrode 152 electrically connected to the right N-type semiconductor region SCP_N through a reverse bias voltage source. When a reverse voltage is applied to the photo transistor, a current does not flow normally, but when ambient light is incident on the P-type semiconductor region SCP_P of the semiconductor pattern SCP, electrons and holes are excited due to a photoelectric effect to generate a forward current between the P-type semiconductor region SCP_P and the left N-type semiconductor region SCP_N, and as a result, a reverse current Ip may flow from the second photo electrode 152 toward the first photo electrode 151. In this case, intensity of the current Ip may correspond to illuminance by ambient light. That is, as the illuminance by the ambient light increases, a larger current Ip may be generated. The current Ip generated by the photo sensor unit PSU may be provided to the photo detector 250.

Referring to FIGS. 4, 5, and 7A to 7C, an embodiment illustrated in FIG. 7C is different from the photodiode and photo transistor illustrated in FIGS. 7A and 7B in that a photo capacitor includes the photoconductor PHC instead of the semiconductor pattern SCP.

In the photo sensor unit PSU, a photoconductor PHC, the first insulating layer IL1, the photo electrodes 150 (e.g., 151 and 152), and the second insulating layer IL2 may be sequentially formed on the base layer 110.

The photoconductor PHC may be a photosensitive pattern in which an electrical change occurs according to whether or not ambient light is incident thereon. For example, the photoconductor PHC may have a thin film or a single crystal formed of cadmium sulfide (CdS). In addition, the photoconductor PHC may also be formed of lead sulfide (PdS), selenium (Se), zinc oxide (ZnO), antimony trisulfide (Sb2S3), or the like.

In addition, the cadmium sulfide (CdS) and the lead sulfide (PdS) are colored materials, and the photoconductor PHC may have a mesh structure so that light output from the display region DA of the display panel 300 passes therethrough, similarly to the photo electrodes 150. Further details may be described below with reference to FIGS. 8C and 9C.

The first insulating layer IL1 may be formed on the photoconductor PHC, and the contact hole CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may be respectively in contact with one side and the other side of the photoconductor PHC through the contact holes CH. In this case, when either an input current or an output current flows to one side, the other current may flow to the other side.

According to an embodiment, a certain voltage may be applied to the photo capacitor. For example, the reverse bias voltage Vbias may be applied to the second photo electrode 152 on the right through a reverse bias voltage source. The photo capacitor or photoconductor PHC need not flow current when no light is incident, but when ambient light is incident on the photoconductor PHC, the current Ip may flow from the second photo electrode 152 toward the first photo electrode 151. In this case, intensity of the current Ip may correspond to illuminance by ambient light. That is, as the illuminance by illuminance by the ambient light increases, a larger current Ip may be generated. The current Ip generated by the photo sensor unit PSU may be provided to the photo detector 250.

Referring to FIGS. 4 to 7C, the touch electrodes 120, the touch wires TSL, the photo electrodes 150, and the photo wires PSL may include conductive materials. For example, the conductive materials may include a metal or an alloy thereof. The metal may include gold (Au), silver (Ag), aluminum (Al), molybdenum (Mo), chromium (Cr), titanium (Ti), nickel (Ni), neodymium (Nd), copper (Cu), platinum (Pt), and/or the like. In addition, the touch electrodes 120, the touch wires TSL, the photo electrodes 150, and the photo wires PSL may also be formed of transparent conductive materials. The transparent conductive materials may include silver nanowire (AgNW), indium tin oxide (ITO), indium zinc oxide (IZO), antimony zinc oxide (AZO), indium tin zinc oxide (ITZO), zinc oxide (ZnO), tin oxide (SnO2), carbon nano tube, graphene, and/or the like.

In addition, the touch electrodes 120, the touch wires TSL, the photo electrodes 150, and the photo wires PSL may also have a single-layer structure or a multi-layer structure. When the touch electrodes 120, the touch wires TSL, the photo electrodes 150, and the photo wires PSL have a multi-layer structure, the touch electrodes 120, the touch wires TSL, the photo electrodes 150, and the photo wires PSL may include multi-layered metal layers. For example, the touch electrodes 120, the touch wires TSL, the photo electrodes 150, and the photo wires PSL may have a three-layer structure of titanium, aluminum, and titanium.

In addition, the touch electrodes 120, the touch wires TSL, the photo electrodes 150, and the photo wires PSL may have a mesh structure through which light output from the display region DA of the display panel 300 passes. For example, the touch electrodes 120, the touch wires TSL, the photo electrodes 150, and the photo wires PSL may include a plurality of mesh holes MH, and some of the base layer 110 or the first insulating layer IL1 may be exposed by the mesh holes MH. The mesh holes MH of the touch electrodes 120, the touch wires TSL, the photo electrodes 150, and the photo wires PSL may overlap a light emission region of the display panel 300 in a third direction (e.g., Z-axis direction) which is a thickness direction. In addition, area of the mesh holes MH may be larger than an area of the light emission region of the display panel 300. Accordingly, even when the touch electrodes 120, the touch wires TSL, the photo electrodes 150, and the photo wires PSL are located on the display region DA of the display panel 300, light output from the display region DA of the display panel 300 is output to the outside by passing through the touch electrodes 120, the touch wires TSL, the photo electrodes 150, and the photo wires PSL because the mesh holes MH are disposed in the touch electrodes 120, the touch wires TSL, the photo electrodes 150, and the photo wires PSL.

The second insulating layer IL2 may be disposed on the touch electrodes 120, the touch wires TSL, the photo electrodes 150, and the photo wires PSL. For example, the second insulating layer IL2 may cover the touch electrodes 120, the touch wires TSL, the photo electrodes 150, and the photo wires PSL. That is, the second insulating layer IL2 may be in contact with the touch electrodes 120, the touch wires TSL, the photo electrodes 150, and the photo wires PSL, and the mesh holes MH and body portions BD disposed in each of the touch electrodes 120, the touch wires TSL, the photo electrodes 150, and the photo wires PSL may be filled with an insulating material forming the second insulating layer IL2. The touch electrodes 120 and the photo electrodes 150 may be insulated from each other by the second insulating layer IL2.

The first and second insulating layers IL1 and IL2 may include an insulating material. In some embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one of acrylic resin, methacrylic resin, polyisoprene, vinyl resin, epoxy resin, urethane resin, cellulose resin, siloxane resin, polyimide resin, polyamide resin, and perylene resin.

Figure 8A:
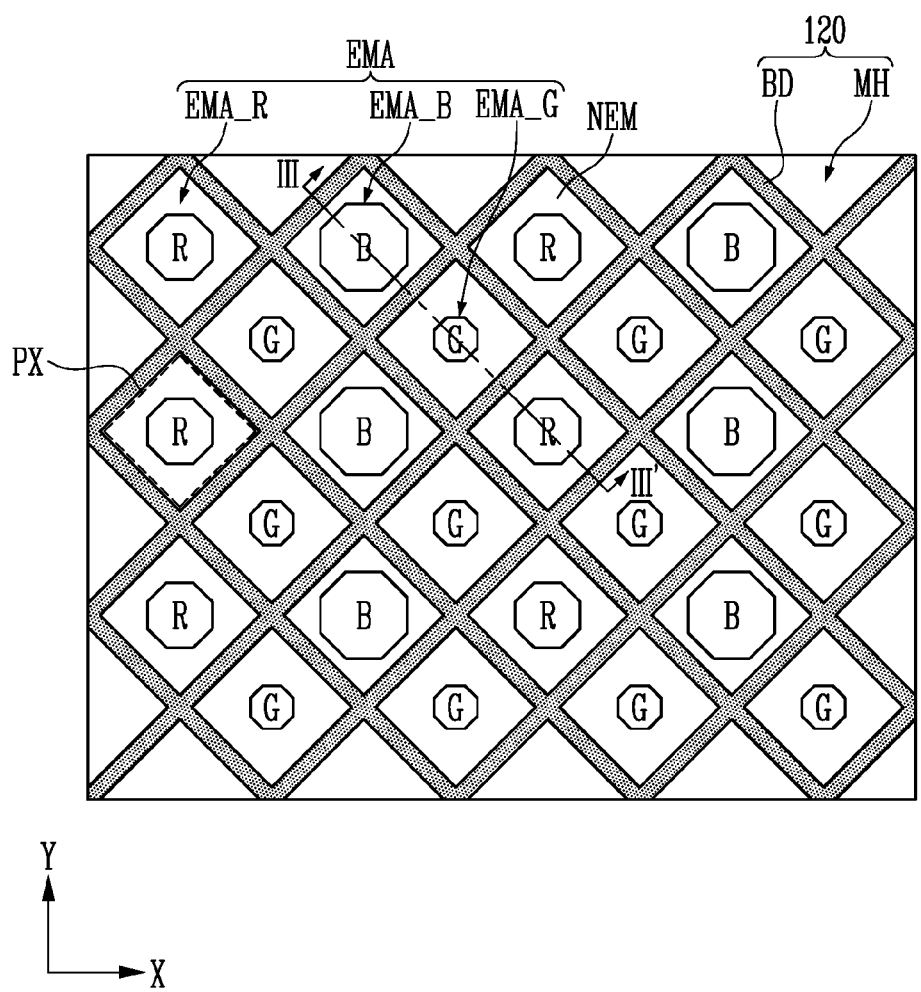
FIG. 8A is a schematic diagram illustrating an arrangement relationship between pixels of a display panel and a touch sensor unit, according to an embodiment.
Figure 8B:
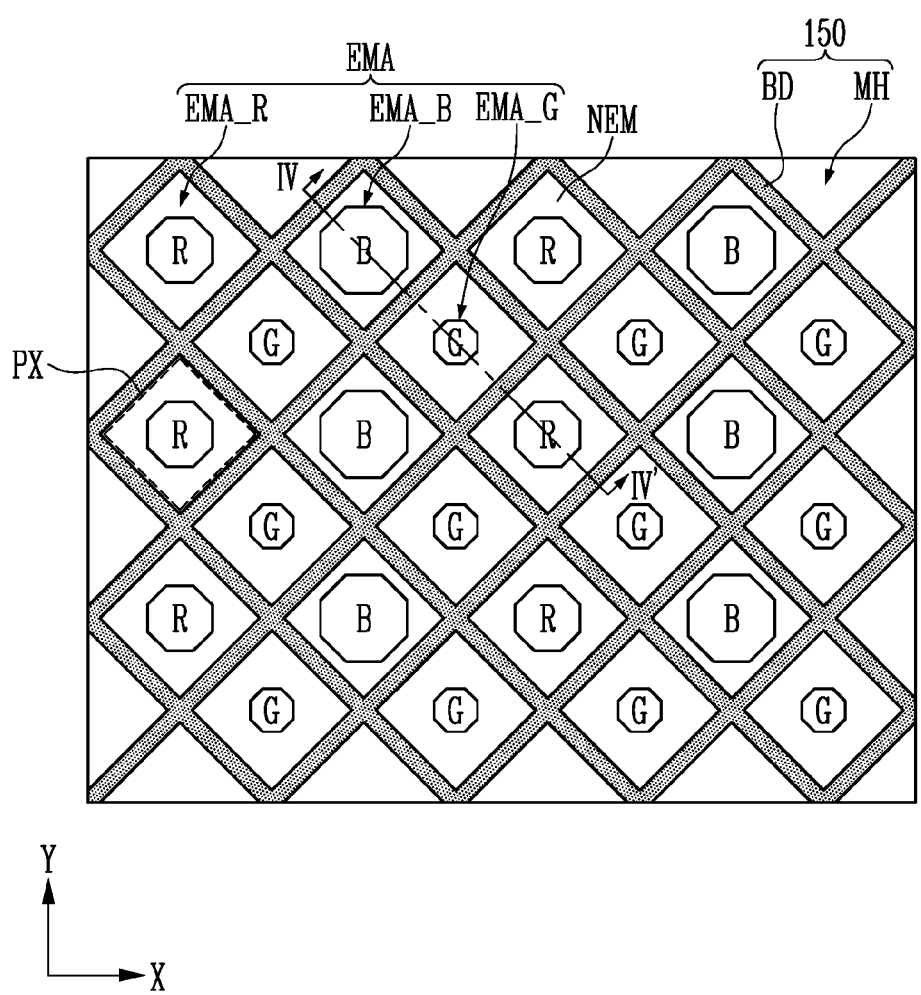
FIG. 8B is a schematic diagram illustrating an arrangement relationship between pixels of a display panel and a photo sensor unit, according to an embodiment.
Figure 8C:
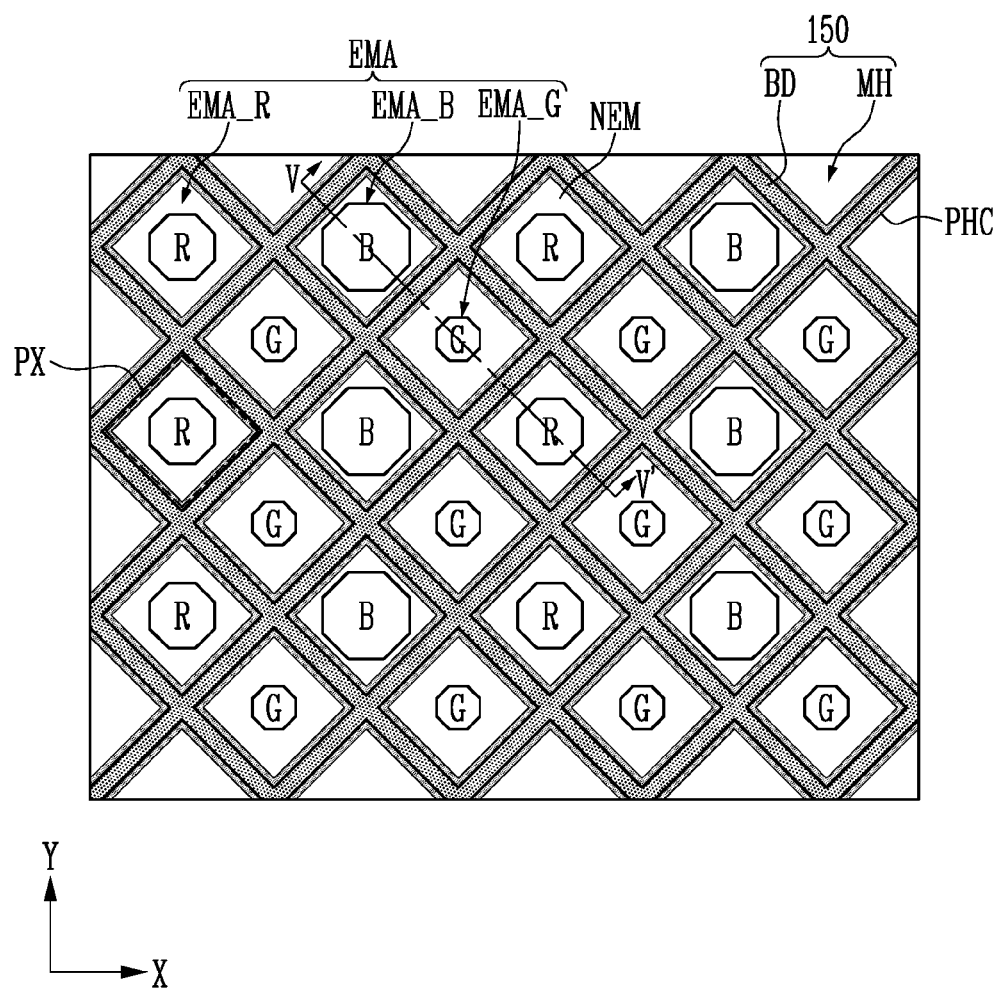
FIG. 8C is a schematic diagram illustrating an arrangement relationship between pixels of a display panel and a photo sensor unit, according to another embodiment.
Figure 9A:
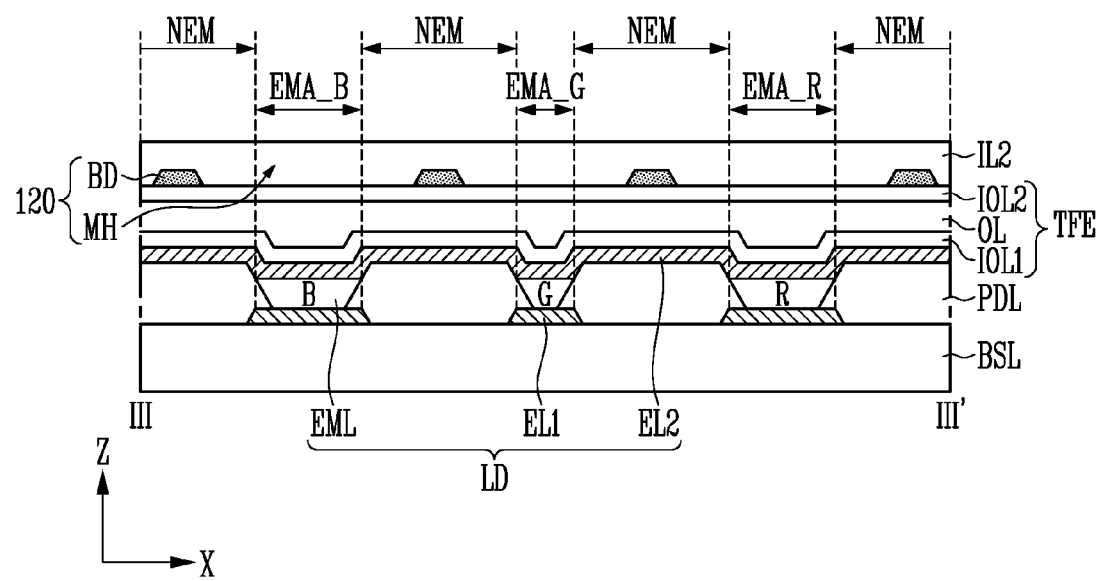
FIG. 9A is a schematic diagram showing a cross-sectional view taken along line III-III' of FIG. 8A.
Figure 9B:
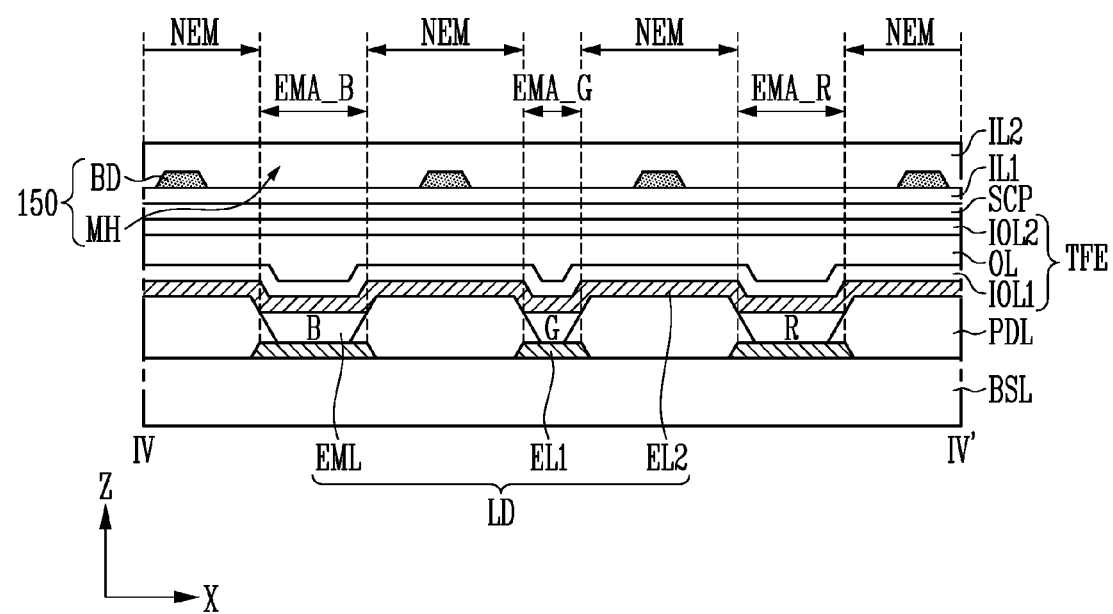
FIG. 9B is a schematic diagram showing a cross-sectional view taken along line IV-IV' of FIG. 8B.
Figure 9C:
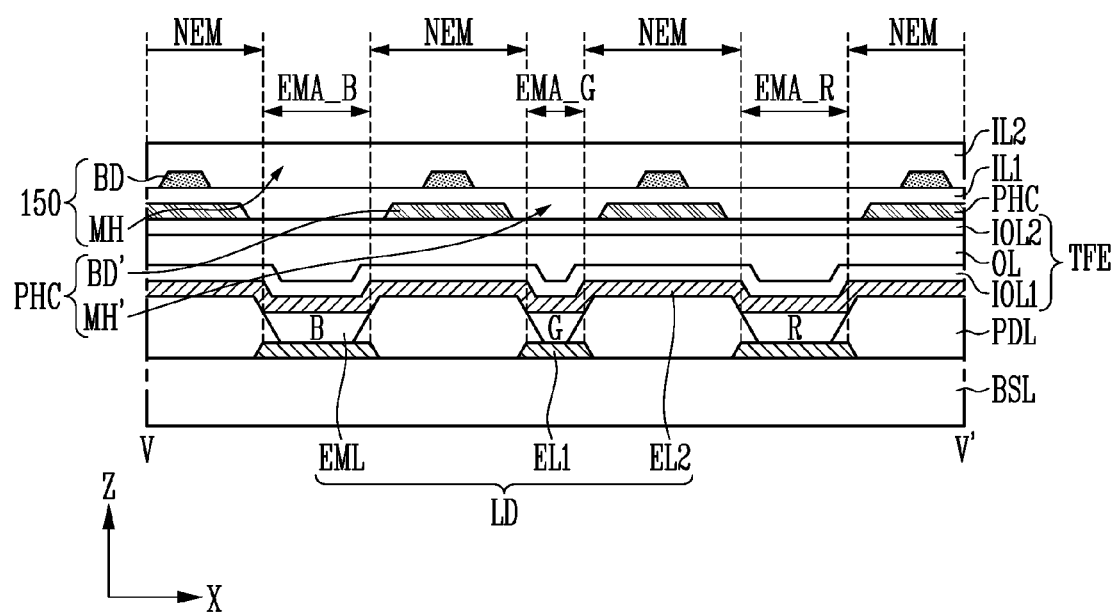
FIG. 9C is a schematic diagram showing a cross-sectional view taken along line V-V' of FIG. 8C.

FIG. 8A illustrates an arrangement relationship between pixels of a display panel and a touch sensor unit, according to an embodiment, FIG. 8B illustrates an arrangement relationship between pixels of a display panel and a photo sensor unit, according to an embodiment, FIG. 8C illustrates an arrangement relationship between pixels of a display panel and a photo sensor unit, according to another embodiment, FIG. 9A shows a cross-sectional view taken along line III-III' of FIG. 8A, FIG. 9B shows a cross-sectional view taken along line IV-IV' of FIG. 8B, and FIG. 9C shows a cross-sectional view taken along line V-V' of FIG. 8C.

Referring to FIGS. 8A and 9A, the display panel 300 includes a plurality of pixels PX. Each of the pixels PX may include a light emission region EMA and a non-light emission region NEM. That is, the display region DA may include the light emission region EMA overlapping a light emitting element LD in a third direction (e.g., Z-axis direction) that is a thickness direction, and a non-light emission region NEM other than the light-emission region EMA.

The pixels PX may include first color pixels, second color pixels, and third color pixels. The color pixels PX may be arranged in various ways. In an embodiment, a first row is formed in a first direction (e.g., X-axis direction), the first color pixels (for example, red pixels) and the second color pixels (for example, blue pixels) are alternately arranged, and the third color pixels (for example, green pixels) may be arranged in a second row adjacent to the first row in the first direction. Pixels in the second row may be alternately arranged in the first direction with respect to the pixels in the first row. The number of third color pixels in the second row may be twice the number of the first color pixels or the second color pixels in the first row. Arrangement of the first row and the second row may be repeated in the first direction.

Sizes of the light emission regions EMA of the color pixels PX may be different from each other. For example, a light emission region EMA_B of the second color pixel may be larger than a light emission region EMA_R of the first color pixel, and a light emission region EMA_G of the third color pixel may be smaller than the light emission region EMA_R of the first color pixel.

A shape of the light emission region EMA of each of the color pixels PX may be substantially octagonal in general. However, the shape of the light emission region EMA is not limited thereto and may be a circle, a rhombus, polygon, a polygon having a round corner, or the like.

The touch electrode 120 may be divided into the mesh hole MH and a body portion BD. The mesh hole MH may overlap the light emission region EMA in a thickness direction, and an area of the mesh hole MH may be larger than an area of the light emission region EMA. The body portion BD may overlap the non-light emission region NEM in the thickness direction, and a width of the body portion BD may be smaller than a width of the non-light emission region NEM. With this structure, light output from the light emission region EMA of the display panel 300 may effectively pass through the touch electrodes 120.

As illustrated in FIG. 9A, a first electrode EL1 is disposed for each of the pixels PX on the base substrate BSL. A pixel defining layer PDL that exposes the first electrode EL1 may be disposed on the first electrode EL1. The pixel defining layer PDL is disposed in the non-light emission region NEM.

The light emission layer EML may be disposed on the first electrode EL1 exposed by the pixel defining layer PDL, and the second electrode EL2 may be disposed thereon. The second electrode EL2 may be entirely disposed without distinction of pixels. The first electrode EL1, the light emission layer EML, and the second electrode EL2 constitute the light emitting element LD.

The thin film encapsulation layer TFE including a first inorganic layer IOL1, an organic layer OL, and a second inorganic layer IOL2 is disposed on the second electrode EL2, and the touch electrodes 120 and the second insulating layer IL2 may be sequentially disposed thereon. The first inorganic layer IOL1 and the second inorganic layer IOL2 may protect the element layer DSL from moisture and oxygen, and the organic layer OL may protect the element layer DSL from foreign materials such as dust particles.

The body portion BP may be disposed to overlap the pixel defining layer PDL and may be located in the non-light emission region NEM. That is, the body portion BP may not interfere with light emission because of not overlapping the light emission region EMA.

Referring to FIGS. 8B and 9B, a region illustrated in FIG. 9B in which the pixel PX and the photo sensor unit of the display panel overlap each other is different from a structure of a region illustrated in FIG. 9A in which the pixel PX and the touch sensor unit of the display panel overlap with each other in that the first insulating layer IL1 and the semiconductor pattern SCP are interposed between the thin film encapsulation layer TFE and the photo electrodes 150. The rest of the configuration is the same as the configuration described with reference to FIG. 9A, and redundant description thereof need not be repeated.

Specifically, the semiconductor pattern SCP may include polysilicon or oxide. In addition, the semiconductor pattern SCP may be subjected to an ion doping process to form the semiconductor pattern SCP as a P-type semiconductor region SCP_P and/or an N-type semiconductor region SCP_N. The semiconductor pattern SCP may have a PN junction structure described with reference to FIG. 7A or a PIN junction structure or may have an NPN junction structure described with reference to FIG. 7B or a PNP junction structure. The first insulating layer IL1 may be formed on the semiconductor pattern SCP.

The photo electrodes 150 may be divided into the mesh hole MH and the body portion BD. The mesh hole MH may overlap the light emission region EMA in a thickness direction, and an area of the mesh hole MH may be larger than an area of the light emission region EMA. The body portion BD may overlap the non-light emission region NEM in the thickness direction, and a width of the body portion BD may be smaller than a width of the non-light emission region NEM. With this structure, light output from the light emission region EMA of the display panel 300 may effectively pass through the photo electrodes 150.

The body portion BP may be disposed to overlap the pixel defining layer PDL and may be located in the non-light emission region NEM. That is, the body portion BP need not interfere with light emission due to not overlapping the light emission region EMA.

Each of the first insulating layer IL1 and the semiconductor pattern SCP may overlap the light emission region EMA and the non-light emission region NEM in a thickness direction.

Referring to FIGS. 8C and 9C, a region illustrated in FIG. 9C in which the pixel PX and the photo sensor unit of the display panel is different from the structure illustrated in FIG. 9B in that the photoconductor PHC instead of the semiconductor pattern SCP is interposed between the first insulating layer IL1 and the thin film encapsulation layer TFE. The rest of the configuration is substantially the same as the configuration described with reference to FIG. 9B, and redundant descriptions thereof need not be repeated.

Specifically, the photoconductor PHC may be divided into a mesh hole MH' and a body portion BD'. The mesh hole MH' may overlap the light emission region EMA and the mesh hole MH of the photo electrode 150 in a thickness direction (e.g., Z-axis direction), and an area of the mesh hole MH' may be larger than an area of the light emission region EMA and may be smaller than an area of the mesh hole MH of the photo electrode 150. However, this is an example, and the area of the mesh hole MH' may be substantially the same as the area of the light emission region EMA and the area of the mesh hole MH of the photo electrode 150.

The body portion BD' may overlap the non-light emission region NEM and the body portion BD of the photo electrode 150 in a thickness direction, and a width of the body portion BD' may be smaller than a width of the non-light emission region NEM and may be larger than a width of the body portion BD of the photo electrode 150. However, this is an example, and the area of the mesh body portion BD' may be substantially the same as the area of the light emission region EMA and the area of the mesh body portion BD of the photo electrode 150. With this structure, light output from the light emission region EMA of the display panel 300 may effectively pass through the photoconductor PHC and the photo electrodes 150.

The first insulating layer IL1 according to an embodiment may be formed of an organic material and may fill the mesh hole MH' of the photoconductor PHC. In an alternate embodiment, touch electrodes (e.g., 120, 120') such as in the embodiment of FIGS. 8A and 9A may be substituted for and/or be added in addition to photo electrodes (e.g., 150, 151, 152) as in the embodiment of FIGS. 8C and 9C, for example. Duplicate description may be omitted.

Figure 10:
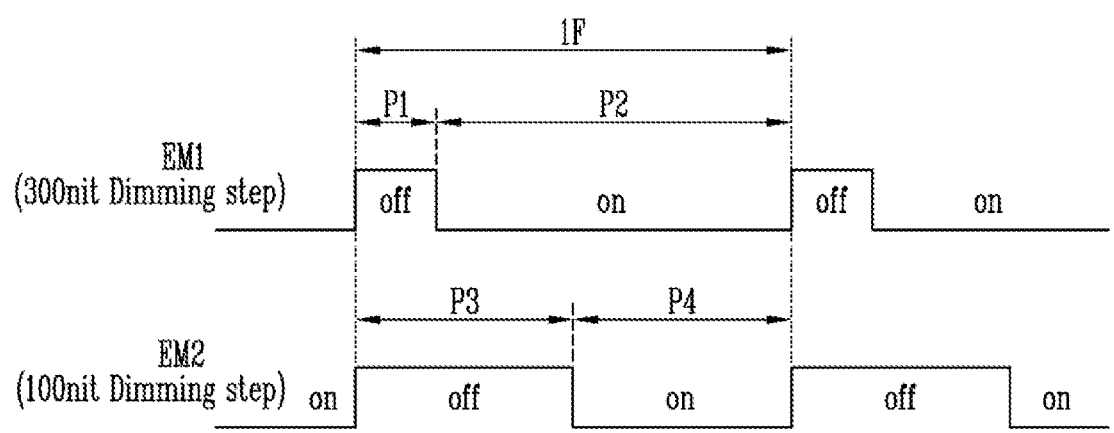
FIG. 10 is a signal timing diagram illustrating an active mode organic light emitting diode (AMOLED) impulsive driving (AID) method using adjustment of an off-duty ratio of a light emission control signal.

FIG. 10 illustrates an active mode organic light emitting diode AMOLED impulsive driving (AID) method using adjustment of an off-duty ratio of a light emission control signal. FIG. 10 shows that, when the light emission control signals EM1 and EM2 are at a logic high level, the pixel is in a non-light emission state, and when the light emission control signals EM1 and EM2 are at a logic low level, the pixel is in a light emission state, but the embodiment is not limited thereto.

The AID method is a method of controlling luminance by controlling a duty ratio of the light emission control signal to correspond to a set dimming step, and changes the luminance by varying an on-period or an off-period of one cycle 1F of the light emission control signal for controlling light emission and non-light emission of the pixel PX. That is, off-duty ratios (hereinafter, referred to as AORs) of the light emission control signal of 0%, 20%, 40%, 60%, 80%, and 95% may be set to adjust luminance by controlling the AOR of the light emission control signal. However, this is an example, and various duty ratios may be set according to design criteria and/or user preferences. According to an embodiment, the display device 1 may drive the number of cycles of the AID to four. That is, the number of off-duties of the light emission control signals included in one frame may be four.

Referring to FIG. 10, an on-period P4 of the light emission control signal EM2 in a 100-nit dimming step is shorter than an on-period P2 of the light emission control signal EM1 in a 300-nit dimming step. In contrast to this, an off-period P3 of the light emission control signal EM2 in the 100-nit dimming step is longer than an off-period P1 in the 300-nit dimming step. Because the pixel emits light during the on-period of the light emission control signal and the pixel does not emit light during the off-period, the on-period of the light emission control signal may be decreased, and as the off-period of the light emission control signal increases, luminance may be decreased. In this case, the AORs of the light emission control signals EM1 and EM2 for each luminance level may be set by considering unique features of the display panel 300.

Figure 11:
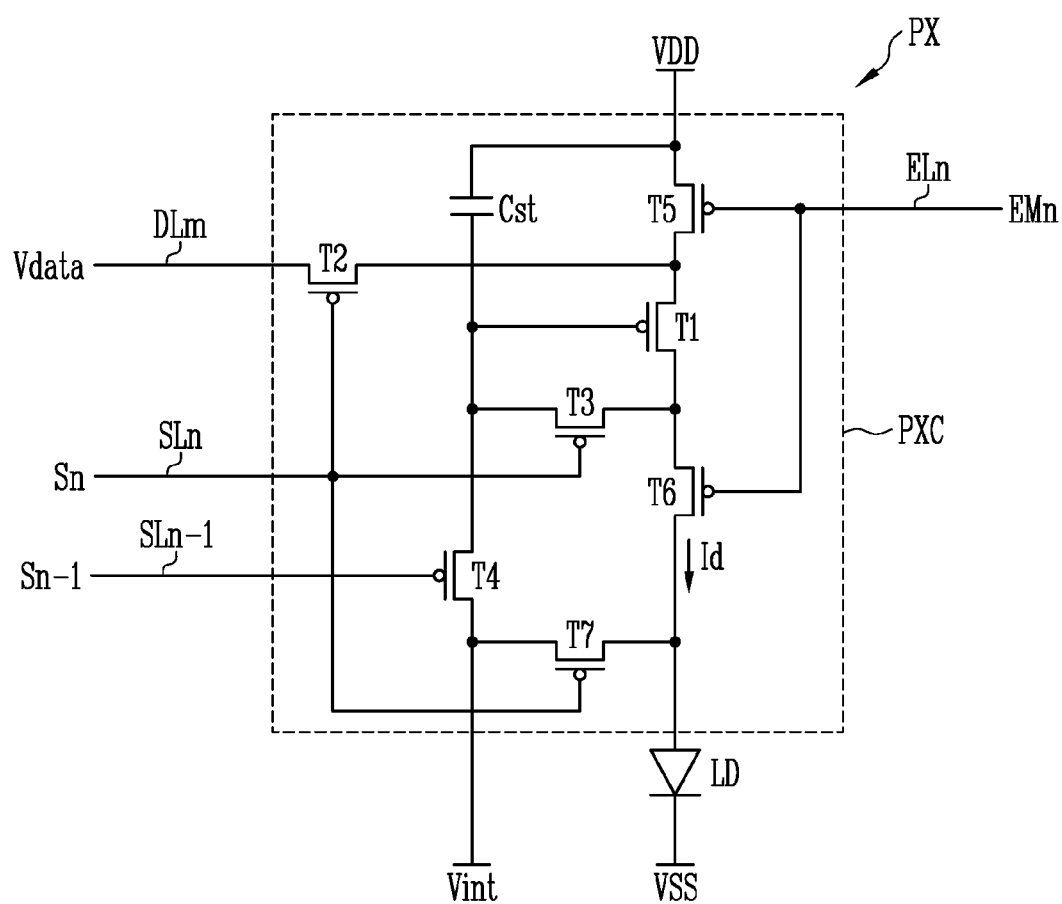
FIG. 11 is a circuit diagram illustrating an example of a pixel illustrated in FIG. 1.
Figure 12:
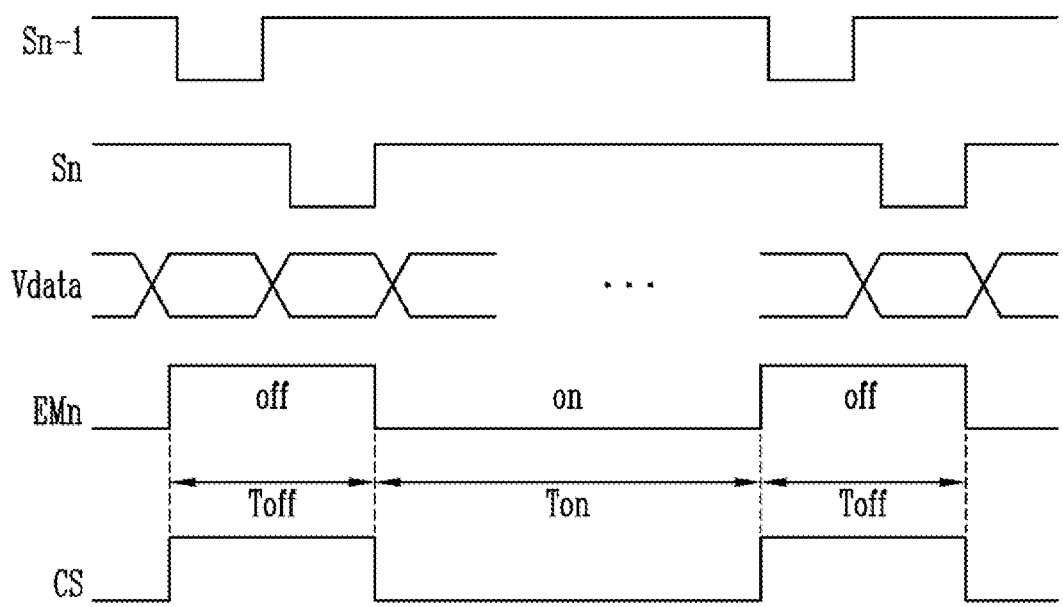
FIG. 12 is a signal timing diagram showing a driving waveform of the pixel illustrated in FIG. 11 according to an embodiment.

FIG. 11 illustrates an example of the pixel illustrated in FIG. 1, and FIG. 12 illustrates a driving waveform diagram of the pixel illustrated in FIG. 11 according to an embodiment.

Referring to FIG. 11, the pixel PX may include a pixel circuit PXC including transistors T1 to T7 and a capacitor Cst, and the light emitting element LD.

The first to seventh transistors T1 to T7 may be thin film transistors (TFTs), and the first to seventh transistors T1 to T7 are illustrated as P-type transistors as an example but may be configured as N-type transistors and may also be driven by inverting driving waveforms of FIG. 12. In addition, in the present embodiment, the pixel circuit PXC is illustrated as including seven transistors of the first to seventh transistors T1 to T7 and one capacitor Cst, but is not limited thereto. The number of transistors and capacitors constituting the pixel circuit PXC may be variously changed.

One electrode of the capacitor Cst may be connected to a first power voltage VDD, and the other electrode may be connected to a gate electrode of the first transistor T1.

The first transistor T1 may have one electrode connected to the other electrode of the fifth transistor T5, the other electrode connected to the one electrode of the sixth transistor T6, and a gate electrode connected to the other electrode of the capacitor Cst. The first transistor T1 may be referred to as a driving transistor.

The second transistor T2 may have one electrode connected to a data line DLm, the other electrode connected to one electrode of the first transistor T1, and a gate electrode connected to a scan line SLn. The second transistor T2 may be referred to as a switching transistor, a scan transistor, or the like.

The third transistor T3 may have one electrode connected to the other electrode of the first transistor T1, the other electrode connected to the gate electrode of the first transistor T1, and a gate electrode connected to the scan line SLn.

The fourth transistor T4 may have one electrode connected to the gate electrode of the first transistor T1, the other electrode connected to an initialization voltage Vint, and a gate electrode connected to a previous scan line SLn−1.

The fifth transistor T5 may have one electrode connected to the first power voltage VDD, the other electrode connected to the one electrode of the first transistor T1, and a gate electrode connected to a light emission control signal line ELn.

The sixth transistor T6 may have one electrode connected to the other electrode of the first transistor T1, the other electrode connected to an anode electrode of the light emitting element LD, and a gate electrode connected to the light emission control signal line ELn. The transistors T5 and T6 may be referred to as a light emitting transistor.

The seventh transistor T7 may have one electrode connected to the anode electrode of the light emitting element LD, the other electrode connected to the initialization voltage Vint, and a gate electrode connected to a present scan line Si. In another embodiment, the gate electrode of the seventh transistor T7 may also be connected to another scan line. For example, the gate electrode of the seventh transistor T7 may also be connected to a previous scan line SLn−1, a previous scan line thereof, or a next scan line (n+1$^{th}$ scan line). When a scan signal of a turn-on level is applied to the present scan line Si, the seventh transistor T7 transmits the initialization voltage to the anode electrode of the light emitting element LD, thereby initializing the amount of charge accumulated in the light emitting element LD.

The light emitting element LD may have the anode electrode connected to the other electrode of the sixth transistor T6 and a cathode electrode connected to a second power voltage VSS. The light emitting element LD may emit light by itself by receiving a driving voltage through the pixel circuit PXC. The light emitting element LD may be composed of an organic light emitting diode or an inorganic light emitting diode such as a micro light emitting diode (LED) or a quantum dot light emitting diode. In addition, the light emitting element LD may also be a light emitting element composed of an organic material and an inorganic material.

Referring to FIG. 12, a previous scan signal Sn−1 of a logic low level is supplied through the previous scan line SLn−1 during an initialization period according to an embodiment of the present disclosure. The fourth transistor T4 may be turned on in response to the previous scan signal Sn−1 of the logic low level, the initialization voltage Vint may be connected to the gate electrode of the first transistor T1 through the fourth transistor T4, and the first transistor T1 may be initialized by the initialization voltage Vint.

Thereafter, a scan signal Sn of a logic low level may be supplied through the scan line SLn during a data programming period. Then, the second transistor T2, the third transistor T3, and the seventh transistor T7 are turned on in response to the scan signal Sn of the logic low level.

In this case, the first transistor T1 is diode-connected by the third transistor T3 which is turned on and is biased in a forward direction.

Then, a compensation voltage Vdata+Vth (where Vth has a negative value) obtained by subtracting a threshold voltage with absolute magnitude Vth of the first transistor T1 from a data signal Vdata supplied from the data line DLm is applied to the gate electrode of first transistor T1.

The first power voltage VDD and the compensation voltage Vdata+Vth are applied to both ends of the capacitor Cst, and charge corresponding to the voltage difference between both ends is stored in the capacitor Cst. Thereafter, during a light emission period Ton, the light emission control signal EMn supplied from the light emission control signal lines EL1 to ELn is changed from a logic high level to a logic low level. The fifth transistor T5 and the sixth transistor T6 are turned on by the light emission control signal EMn of a logic low level during the light emission period Ton.

A driving current Id is generated due to a voltage difference between a voltage of the gate electrode of the first transistor T1 and the first power voltage VDD, and the driving current Id is supplied to the light emitting element LD through the sixth transistor T6.

During the light emission period, a gate-source voltage Vgs of the first transistor T1 may be maintained at {(Vdata+Vth)−VDD} by the capacitor Cst, and the driving current Id according to a current-voltage relationship may be proportional to a square of a value {(Vdata−VDD)$^2$} obtained by subtracting the threshold voltage from the gate-source voltage. That is, light emission luminance of the organic light emitting diode LD may be controlled according to the data signal Vdata.

In addition, the light emission luminance may be controlled according to the off-duty ratio (AOR) of a non-light emission period Toff of the light emitting element LD by the light emission control signal EMn. Even when the same data signal Vdata is applied, as one cycle including the light emission period Ton and the non-light emission period Toff, for example, the off-duty ratio (AOR) of the non-light emission period Toff with respect to a display period of one frame is increased, the light emission luminance of the light emitting element LD is decreased. Accordingly, the light emission luminance of the light emitting element LD may be controlled according to the data signal Vdata and the light emission control signal EMn.

Referring now to FIG. 1 and FIGS. 10 to 12, the panel driver 400 according to an embodiment of the present disclosure may supply the control signal CS to the controller 200 of the touch sensor TSM exclusively during a period overlapping the light emission control signal EM. In this case, the control signal CS may be a signal for detecting the current Ip flowing between the first photo electrode 151 and the second photo electrode 152 through the photo sensor unit PSU. That is, the controller 200 of the touch sensor TSM may detect the current Ip through the photo sensor unit PSU exclusively during the off-period of the light emission control signal EM.

The controller 200 according to an embodiment may detect the current Ip exclusively during the off-period of the light emission control signal EM supplied through the light emission control line EL connected to rows of at least one pixel PX located in a line adjacent to the photo sensor unit PSU.

As illustrated in FIGS. 8B and 9B, the semiconductor pattern SCP may be disposed to overlap the light emission region EMA in the third direction (Z-axis direction) that is a thickness direction. Accordingly, the semiconductor pattern SCP may obtain a photoelectric effect due to light incident from the light emission region EMA of the display panel 300 in addition to ambient light incident from the outside of the display device 1. For example, when the photoelectric effect is obtained due to light incident from the light emission region EMA of the display panel 300, the current Ip flowing between the first photo electrode 151 and the second photo electrode 152 may increase. Therefore, when the current Ip is detected through the photo sensor unit PSU exclusively during the off-period of the light emission control signal EM, exclusively the current Ip generated by the ambient light incident from the outside may be detected, and thus, light sensing efficiency of the semiconductor pattern SCP may be increased.

Hereinafter, other embodiments will be described. In the following embodiments, descriptions on the same configuration as in the previously described embodiments may be omitted or simplified, and a difference therebetween will be mainly described.

Figure 13:
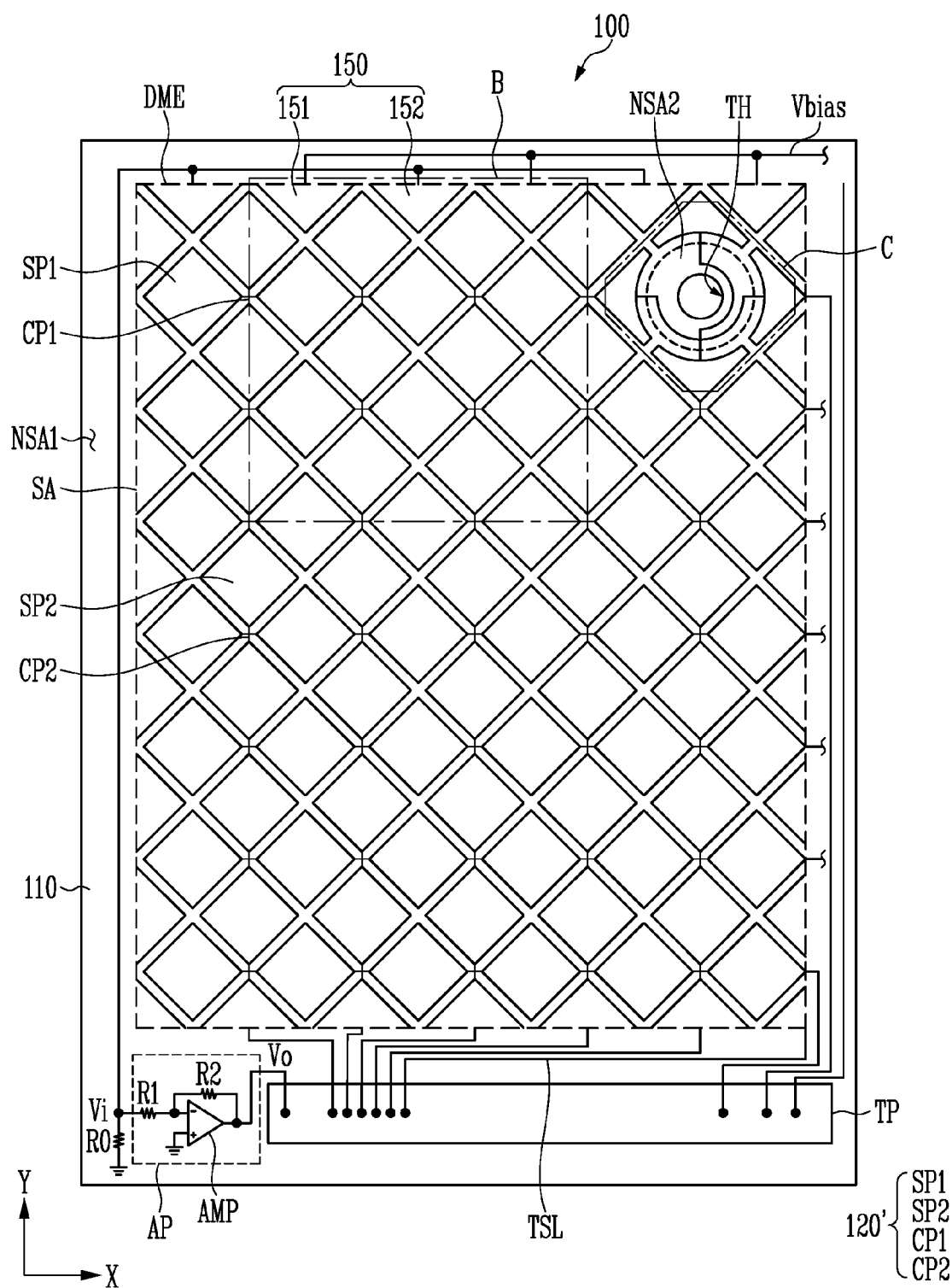
FIG. 13 is a schematic hybrid diagram showing a plan view of a sensor unit included in a display device according to another embodiment.
Figure 14:
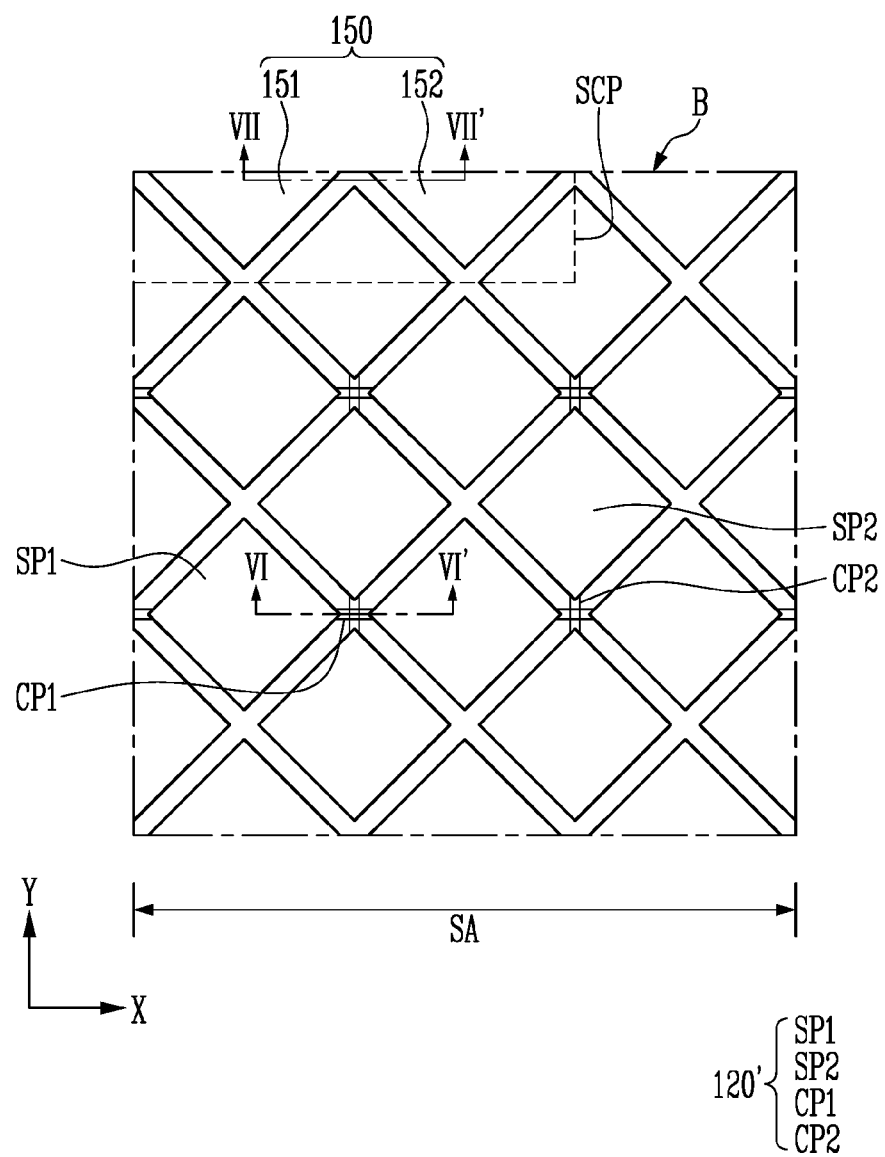
FIG. 14 is a schematic diagram showing an enlarged plan view of a portion B of FIG. 13.
Figure 15B:
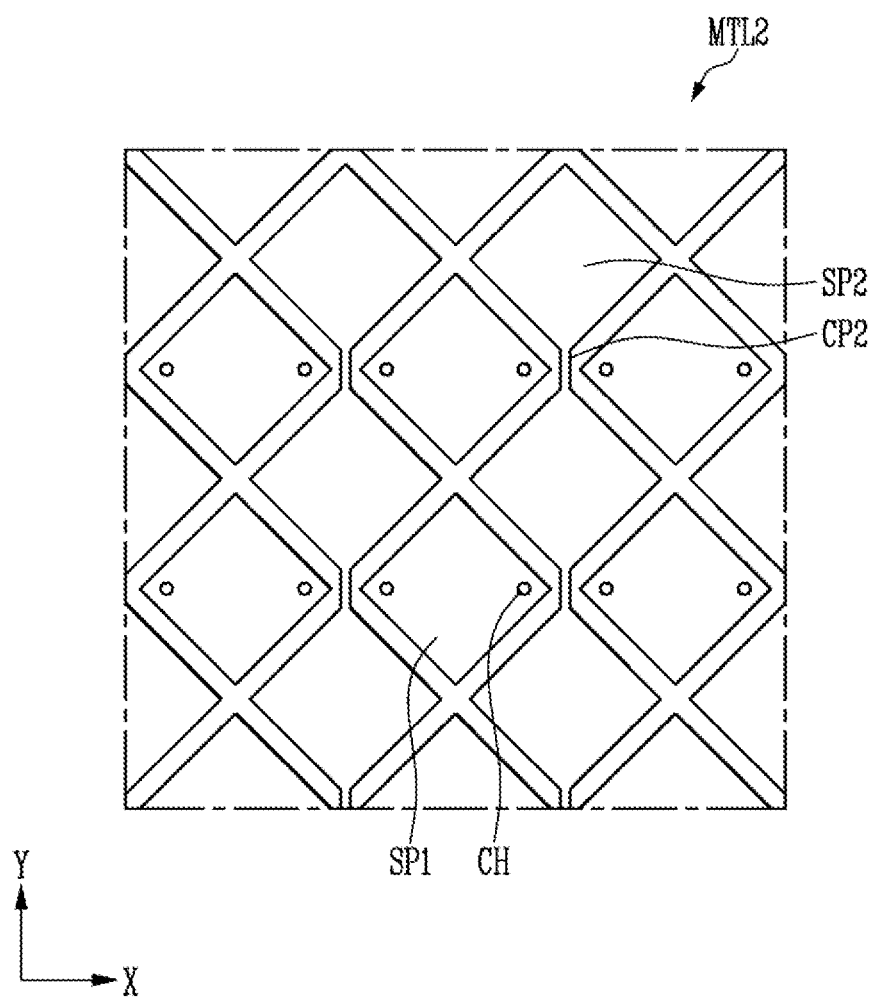
Figure 15C:
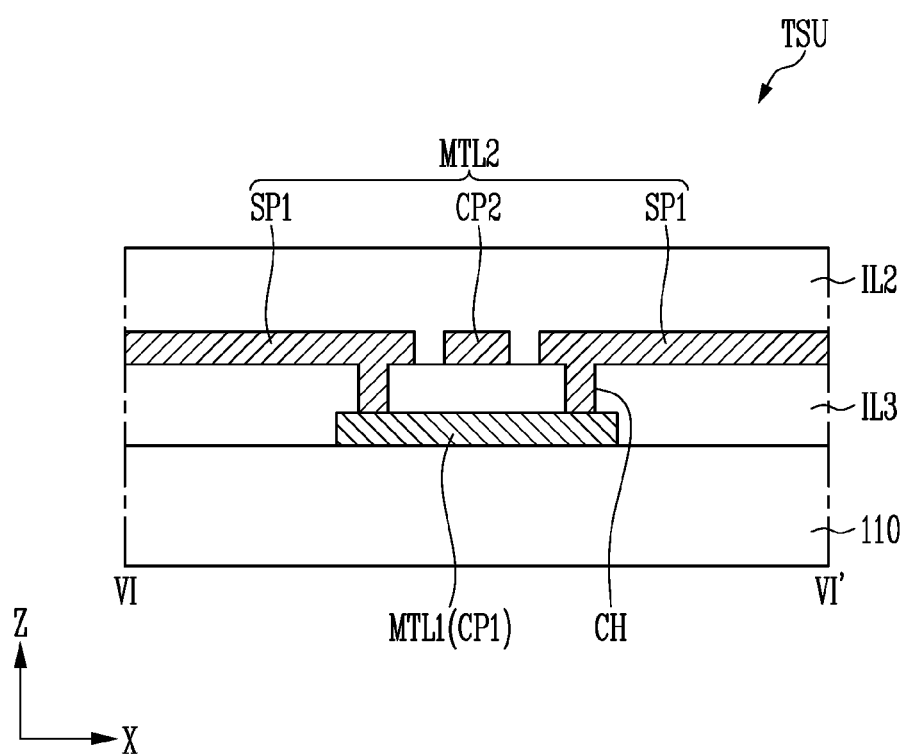
FIG. 15C is a schematic diagram showing a cross-sectional view illustrating the sensor unit according to the embodiment of the present disclosure.

FIG. 13 shows a plan view of a sensor unit included in a display device according to another embodiment, FIG. 14 shows an enlarged plan view of a portion B of FIG. 13, FIGS. 15A and 15B show plan views respectively illustrating a first metal layer and a second metal layer of a sensor unit according to an embodiment of the present disclosure, and FIG. 15C shows a cross-sectional view illustrating the sensor unit according to the embodiment of the present disclosure and may correspond to a cross section taken along line VI-VI' of FIG. 14.

Referring to FIGS. 13 and 14, a display device 1' illustrated in FIG. 13 is different from the display device 1 illustrated in FIG. 1 in that the sensor unit 100 includes two metal layers and a through hole TH. In this case, the through hole TH may penetrate the display device 1' in the third direction (e.g., Z-axis direction), and an electronic element may be disposed in the through hole TH. The electronic element may be a camera element, a speaker element, a light sensing element, a heat sensing element, a microphone element, or the like.

Referring to FIGS. 3, 13, and 14, the sensor unit 100 may include the touch sensor unit TSU and the photo sensor unit PSU. In this case, the sensor unit 100 may be formed on the base layer 110 or the thin film encapsulation layer TFE and may include a sensing region SA, a non-sensing region NSA1, and a hole non-sensing region NSA2. The sensing region SA may be a region that senses a touch input, and the non-sensing region NSA1 and the hole non-sensing region NSA2 may be regions that do not detect the touch input.

The touch sensor unit TSU may include touch electrodes 120' located in the sensing region SA. The touch electrodes 120' may include first sensing electrodes SP1 and second sensing electrodes SP2. The first sensing electrodes SP1 are arranged in the X direction, and the second sensing electrodes SP2 are arranged in the Y direction crossing the first sensing electrodes SP1. The first sensing electrodes SP1 and the second sensing electrodes SP2 may vertically cross each other.

The first sensing electrodes SP1 and the second sensing electrodes SP2 may have corners adjacent to each other. The first sensing electrodes SP1 may be electrically connected to each other through first connection electrodes CP1, and the second sensing electrodes SP2 may be electrically connected to each other through second connection electrodes CP2.

The first sensing electrodes SP1 and the second sensing electrodes SP2 may be electrically connected to the controller 200 and may receive a driving signal Ts for detecting a touch from the controller 200. In addition, the touch electrodes 120' may output a sensing signal Rs for detecting a touch to the controller 200. The first sensing electrodes SP1 and the second sensing electrodes SP2 may be connected to a pad portion TP through touch wires TSL.

Referring to FIGS. 15A and 15B, the first sensing electrode SP1 and the second sensing electrode SP2 may be disposed on the same layer. A first metal layer MTL1 may include the first connection electrodes CP1 (see FIG. 15A), and a second metal layer MTL2 may include the first sensing electrodes SP1, the second sensing electrodes SP2, and the second connection electrodes CP2 (see FIG. 15B).

The second sensing electrodes SP2 may be connected by the second connection electrodes CP2 arranged on the same layer. The first sensing electrodes SP1 may be arranged in the X direction and may be connected by the first connection electrodes CP1 arranged on a different layer.

Referring to FIG. 15C, a third insulating layer IL3 may be interposed between the first metal layer MTL1 and the second metal layer MTL2. The first sensing electrodes SP1 arranged on the second metal layer MTL2 may be connected to the first connection electrodes CP1 arranged on the first metal layer MTL1 through the contact holes CH of the third insulating layer IL3. The second metal layer MTL2 may be covered with the second insulating layer IL2. FIG. 14 and FIGS. 15A to 15C briefly illustrate the first sensing electrodes SP1, the first connection electrodes CP1, the second sensing electrodes SP2, and the second connection electrodes CP2 for the sake of convenient description but may have a mesh structure as illustrated in FIG. 5.

Figure 16A:
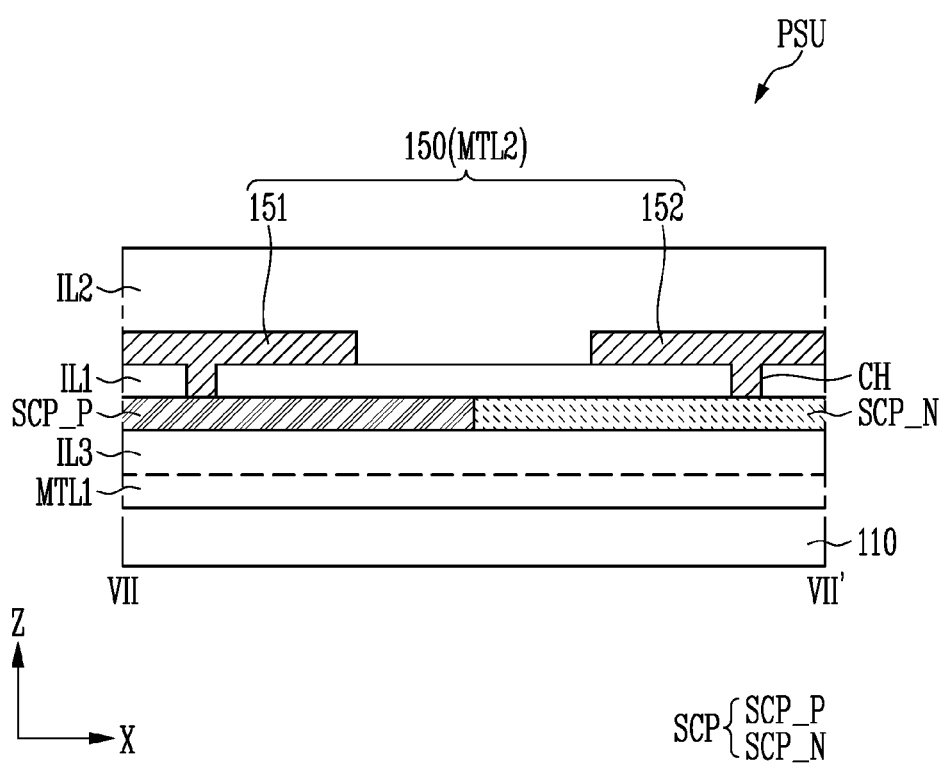
FIGS. 16A to 16C are schematic diagrams showing cross-sectional views of a photo sensor unit taken along VII-VII' of FIG. 14 according to various embodiments.
Figure 16B:
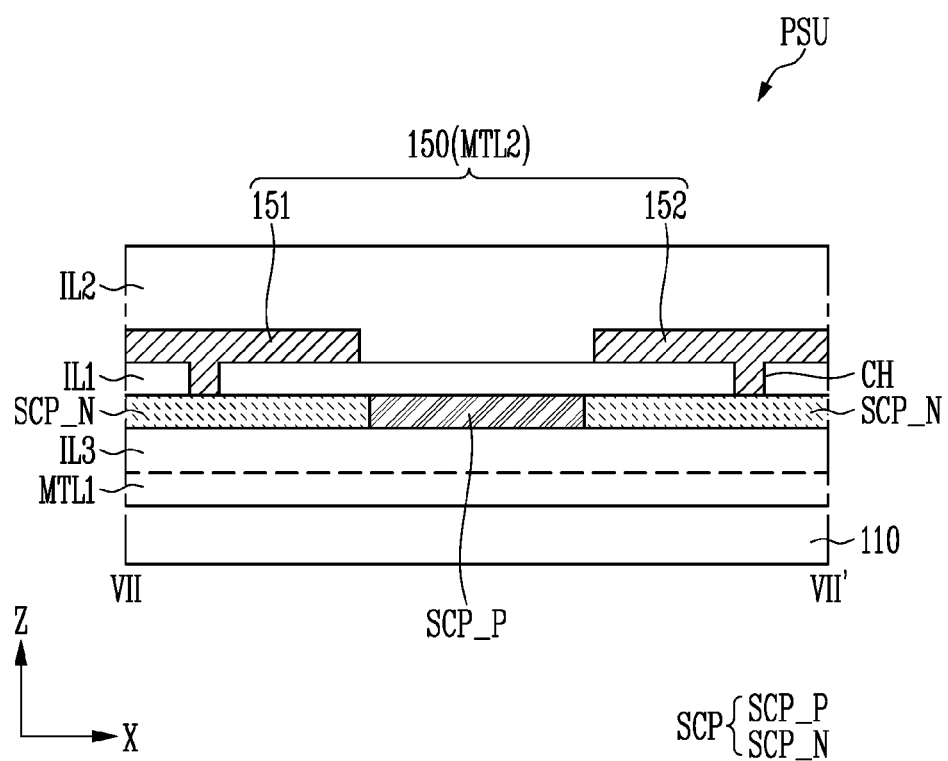
Figure 16C:
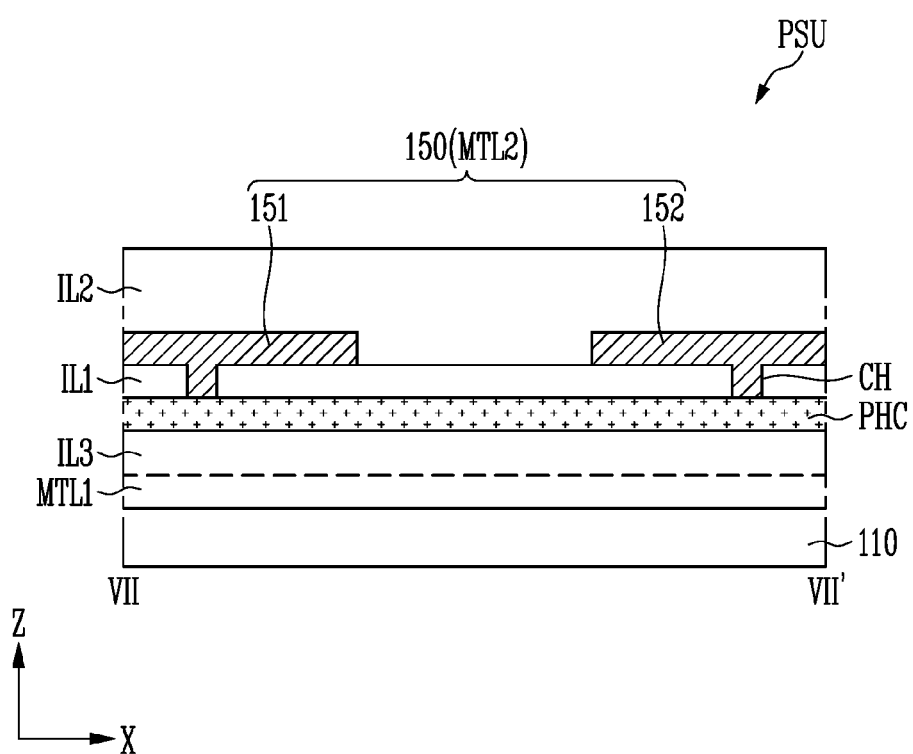

FIGS. 16A to 16C show cross-sectional views of a photo sensor unit taken along VII-VII' of FIG. 14 according to various embodiments.

Referring to FIG. 14 and FIGS. 16A to 16C, embodiments illustrated in FIGS. 16A to 16C are different from the embodiments illustrated in FIGS. 7A to 7C in that a first metal layer MTL1 and a third insulating layer IL3 are further included.

Specifically, as illustrated in FIG. 16A, the photo sensor unit PSU may include the first metal layer MTL1, the third insulating layer IL3, the semiconductor pattern SCP, the first insulating layer IL1, the photo electrodes 150 (or the second metal layer MTL2), and the second insulating layer IL2 which are sequentially formed on the base layer 110.

The first metal layer MTL1 may include the first connection electrode CP1. However, the photo electrodes 150 are not electrically connected to the first sensing electrodes SP1 or the second sensing electrodes SP2 because of being formed by using dummy touch electrodes DME. Therefore, the first connection electrode CP1 may not be formed on the first metal layer MTL1 overlapping the photo sensor unit PSU.

The third insulating layer IL3 may be disposed on the first metal layer MTL1. The third insulating layer IL3 may include an insulating material. In some embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one of acrylic resin, methacrylic resin, polyisoprene, vinyl resin, epoxy resin, urethane resin, cellulose resin, siloxane resin, polyimide resin, polyamide resin, and perylene resin.

The semiconductor pattern SCP may include polysilicon or oxide. In addition, the semiconductor pattern SCP may be subjected to an ion doping process so that one region of the semiconductor pattern SCP is formed as a P-type semiconductor region SCP_P, and the other region except for the one region is formed as an N-type semiconductor region SCP_N. That is, the semiconductor pattern SCP illustrated in FIG. 7A may be a photodiode having a PN junction structure.

The first insulating layer IL1 may be formed on the semiconductor pattern SCP, and the contact holes CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may be respectively in contact with the P-type semiconductor region SCP_P and the N-type semiconductor region SCP_N through the contact holes CH. In FIG. 7A, each of the first photo electrode 151 and the second photo electrode 152 is in contact with each of the P-type semiconductor region SCP_P and the N-type semiconductor region SCP_N through one contact hole CH but is not limited thereto and may be in contact through two or more contact holes CH.

According to an embodiment, a reverse voltage may be applied to a photodiode. For example, the reverse bias voltage Vbias may be applied to the second photo electrode 152 electrically connected to the N-type semiconductor region SCP_N through a reverse bias voltage source. When the reverse voltage is applied to the P-type semiconductor region SCP_P and the N-type semiconductor region SCP_N, a current does not flow normally, but, when ambient light is incident on the semiconductor pattern SCP, electrons and holes are excited due to a photoelectric effect to generate a reverse current. For example, the current Ip may flow from the second photo electrode 152 toward the first photo electrode 151. In this case, intensity of the current Ip may correspond to the illuminance by the ambient light. That is, as the illuminance by the ambient light is increased, a larger current Ip may be generated. The current Ip generated by the photo sensor unit PSU may be provided to the photo detector 250.

FIG. 16A illustrates a photodiode in which the semiconductor pattern SCP has a PN junction structure but is not limited thereto, and the photodiode may also be a photodiode having a PIN junction structure further including an intrinsic semiconductor region which is a depletion layer between the P-type semiconductor region SCP_P and the N-type semiconductor region SCP_N.

Referring to FIG. 16B, the semiconductor pattern SCP illustrated in FIG. 16B is different from the semiconductor pattern SCP illustrated in FIG. 16A which is a photodiode having a PN junction structure in that the semiconductor pattern SCP illustrated in FIG. 16B is a photo transistor having an NPN junction structure. However, the semiconductor pattern SCP illustrated in FIG. 16B is an example and may also be applied to a photo transistor having a PNP junction structure.

The photo sensor unit PSU may include the first metal layer MTL1, the third insulating layer IL3, the semiconductor pattern SCP, the first insulating layer IL1, the photo electrode 150 (or the second metal layer MTL2), and the second insulating layer IL2 which are sequentially formed on the base layer 110.

The semiconductor pattern SCP may include polysilicon or oxide. In addition, the semiconductor pattern SCP may be subjected to an ion doping process so that both ends of the semiconductor pattern SCP are formed as the N-type semiconductor region SCP_N, and a region between the both end regions is formed as the P-type semiconductor region SCP_P. The first insulating layer IL1 may be formed on the semiconductor pattern SCP, and the contact holes CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may be in contact with the N-type semiconductor region SCP_N formed in both end regions through the contact holes CH. For the sake of convenient description, hereinafter, the N-type semiconductor region SCP_N connected to the first photo electrode 151 is referred to as a left N-type semiconductor region SCP_N, and the N-type semiconductor region SCP_N connected to the second photo electrode 152 is referred to as a right N-type semiconductor region SCP_N as illustrated in FIG. 7B.

According to an embodiment, a reverse voltage may be applied to a photo transistor. For example, the reverse bias voltage Vbias may be applied to the second photo electrode 152 electrically connected to the right N-type semiconductor region SCP_N through a reverse bias voltage source. When the reverse voltage is applied to the photo transistor, a current does not flow normally, but when ambient light is incident on the P-type semiconductor region SCP_P of the semiconductor pattern SCP, electrons and holes are excited due to a photoelectric effect to generate a forward current between the P-type semiconductor region SCP_P and the left N-type semiconductor region SCP_N, and as a result, the reverse current Ip flows from the second photo electrode 152 toward the first photo electrode 151. In this case, intensity of the current Ip may correspond to luminance of ambient light. That is, as the illuminance by the ambient light increases, a larger current Ip may be generated. The current Ip generated by the photo sensor unit PSU may be provided to the photo detector 250.

Referring to FIG. 16C, an embodiment illustrated in FIG. 16C is different from the photodiode and photo transistor illustrated in FIGS. 16A and 16B in that a photo capacitor includes the photoconductor PHC instead of the semiconductor pattern SCP.

The photo sensor unit PSU may include the first metal layer MTL1, the third insulating layer IL3, the photoconductor PHC, the first insulating layer IL1, the photo electrode 150 (or the second metal layer MTL2), and the second insulating layer IL2 which are sequentially formed on the base layer 110.

The photoconductor PHC may be a photosensitive pattern in which an electrical change occurs according to whether or not ambient light is incident. For example, the photoconductor PHC may have a thin film or a single crystal formed of cadmium sulfide (CdS). In addition, the photoconductor PHC may also be formed of lead sulfide (PdS), selenium (Se), zinc oxide (ZnO), antimony trisulfide (Sb2S3), or the like.

In addition, although not illustrated in the drawings, the cadmium sulfide (CdS) and the lead sulfide (PdS) are colored materials, and the photoconductor PHC may have a mesh structure so that light output from the display region DA of the display panel 300 passes therethrough, similarly to the photo electrodes 150.

The first insulating layer IL1 may be formed on the photoconductor PHC, and the contact hole CH may be formed to penetrate the first insulating layer IL1. In addition, a metal layer may be formed on the first insulating layer IL1 and patterned to form the first photo electrode 151 and the second photo electrode 152. The first photo electrode 151 and the second photo electrode 152 may be respectively in contact with one side and the other side of the photoconductor PHC through the contact holes CH. In this case, when either an input current or an output current flows to one side, the other current may flow to the other side.

According to an embodiment, a certain voltage may be applied to the photo capacitor. For example, the reverse bias voltage Vbias may be applied to the second photo electrode 152 on the right through a reverse bias voltage source. The photo capacitor (or photoconductor PHC) does not flow a current when no light is incident, but when ambient light is incident on the photoconductor PHC, the current Ip may flow from the second photo electrode 152 toward the first photo electrode 151. In this case, intensity of the current Ip may correspond to luminance of ambient light. That is, as the illuminance by the ambient light increases, a larger current Ip may be generated. The current Ip generated by the photo sensor unit PSU may be provided to the photo detector 250.

Figure 17:
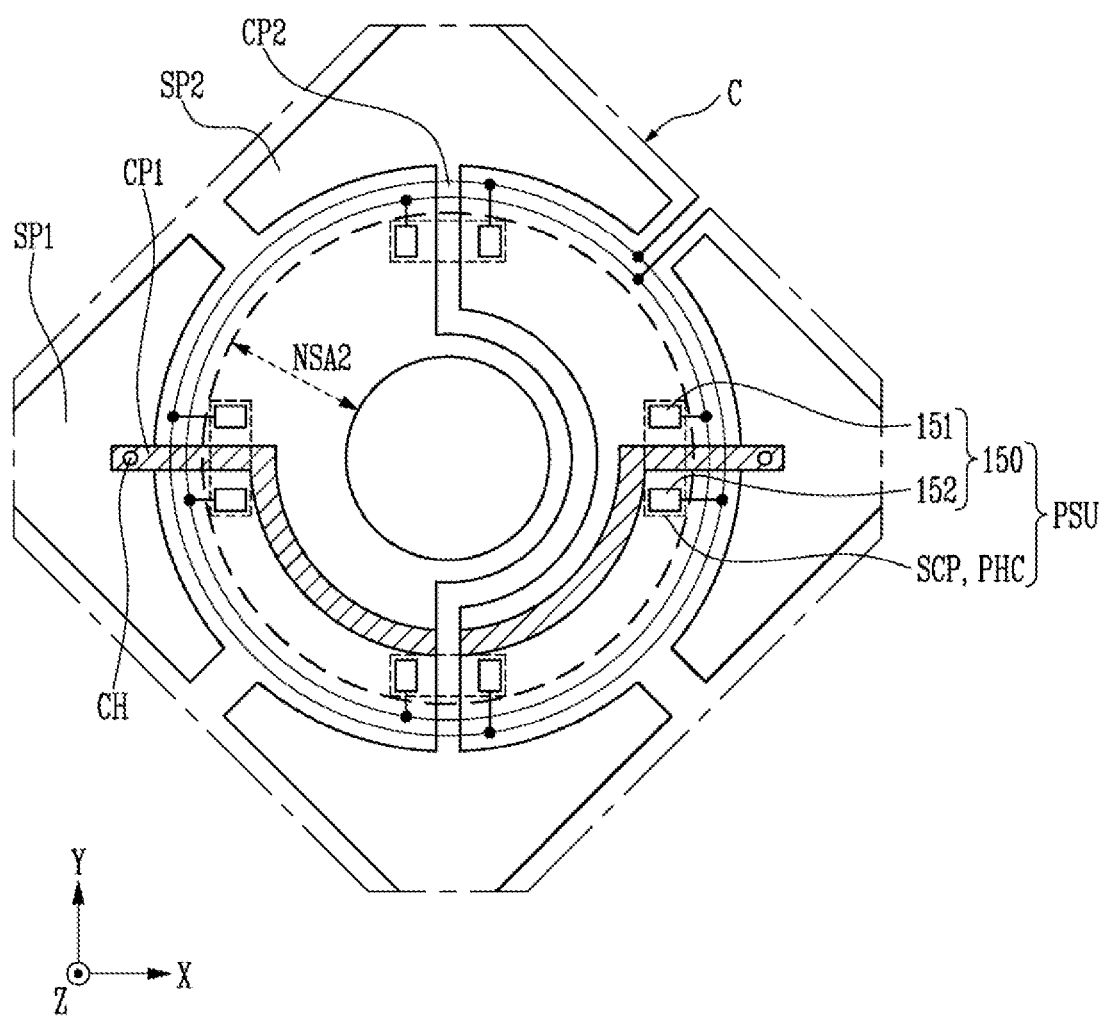
FIG. 17 is a schematic diagram showing an enlarged plan view of a portion C of FIG. 13.

FIG. 17 shows an enlarged plan view of a portion C of FIG. 13.

Referring to FIGS. 13 to 17, a hole non-sensing region NSA2 may be a region between a through hole TH and a sensing region SA and have the same shape as the through hole TH, and an area of the non-sensing region NSA2 may be larger than an area of the through hole TH. For example, the hole non-sensing region NSA2 may have a circular shape (or a donut shape) including a circular cavity in the center.

Two first sensing electrodes SP1 spaced apart from each other in the hole non-sensing region NSA2 in a first direction (X-axis direction) with the through hole TH interposed therebetween may be connected to each other through a first connection electrode CP1 bypassing the periphery of the through hole TH. In addition, two second sensing electrodes SP2 spaced apart from each other in the hole non-sensing region NSA2 in a second direction (Y-axis direction) with the through hole TH interposed therebetween may be connected to each other through the second connection electrode CP2 bypassing the periphery of the through hole TH.

The first connection electrode CP1 and the first sensing electrodes SP1 are located on different layers, and the first sensing electrodes SP1 may be connected to the first connection electrode CP1 through the contact hole CH formed in the third insulating layer IL3.

Although not illustrated in the drawings, the hole non-sensing region NSA2 may correspond to a hole non-display region of the display device 1. The hole non-display region may be a region which surrounds the through hole TH and in which an image is not displayed.

The photo sensor unit PSU may be formed in the hole non-sensing region NSA2. According to an embodiment, the photo sensor unit PSU may be formed one by one in regions respectively corresponding to the first sensing electrode SP1 and the second sensing electrode SP2 surrounding the through hole TH. For example, when the two first sensing electrodes SP1 and the two second sensing electrodes SP2 are disposed around the through hole TH, four photo sensor units PSU may be arranged in the hole non-sensing region NSA2.

The first photo electrode 151 and the second photo electrode 152 may have a square shape and are not limited thereto. The first photo electrode 151 and the second photo electrode 152 may have various shapes such as a polygonal shape and a circular shape. In addition, the first photo electrode 151 and the second photo electrode 152 according to an embodiment are formed by using partial regions of the first sensing electrodes SP1 and the second sensing electrodes SP2, and thus areas of the first photo electrode 151 and the second photo electrode 152 may be smaller than areas of the first sensing electrode SP1 and the second sensing electrode SP2.

The semiconductor pattern SCP or the photoconductor PHC may be formed to overlap the photo electrodes 150 in a third direction (Z-axis direction) that is a thickness direction. The semiconductor pattern SCP or the photoconductor PHC may have the same shape as the touch electrodes 120 and the photo electrodes 150. For example, the semiconductor pattern SCP or the photoconductor PHC may have a square shape but is not limited thereto. The semiconductor pattern SCP or the photoconductor PHC may have various shapes such as a polygonal shape and a circular shape. In addition, the semiconductor pattern SCP or the photoconductor PHC may have a larger area than the photo electrodes 150. However, this is an example, and the shape and area of the semiconductor pattern SCP or the photoconductor PHC may be modified as long as ambient light is absorbed and electrons and holes are excited due to a photoelectric effect to generate a current.

A cross-sectional structure of the photo sensor unit PSU is similar to the cross-sectional structures illustrated in FIGS. 16A to 16C, and redundant description will not be repeated. However, the hole non-sensing region NSA1 includes the first connection electrode CP1 bypassing the through hole TH, and thus, the first connection electrode CP1 may be included in the first metal layer MTL1 in a region where the photo sensor unit PSU is formed to overlap the first connection electrode CP1 in the third direction (or, Z-axis direction) in a thickness direction.

Although the above description is made with reference to embodiments of the present disclosure, those of ordinary skill in the pertinent art will be able to understand that the present disclosure may be variously modified and changed without departing from the concepts and scope of the present disclosure as set forth in the following claims.

What is claimed is:

1. A display device comprising:
a display panel including a display region and a non-display region; and
a sensor unit which is disposed on the display panel and includes a sensing region and a non-sensing region,
wherein the sensor unit includes a touch sensor unit which includes a plurality of touch electrodes and a photo sensor unit which includes a plurality of photo electrodes, and
the touch electrodes are arranged in a matrix form in the sensing region, and the photo electrodes are disposed between the touch electrodes on a plane.

2. The display device of claim 1, wherein
the photo sensor unit includes a first photo electrode, a second photo electrode, and a semiconductor pattern, and
the first photo electrode and the second photo electrode overlap the semiconductor pattern in a thickness direction.

3. The display device of claim 2, wherein
the semiconductor pattern includes polysilicon or oxide.

4. The display device of claim 2, wherein
an insulating layer is interposed between at least one of the first photo electrode or the second photo electrode and the semiconductor pattern.

5. The display device of claim 4, wherein
the semiconductor pattern includes a P-type semiconductor region and an N-type semiconductor region,
the first photo electrode is electrically connected to the P-type semiconductor region through a first contact hole in the insulating layer, and
the second photo electrode is electrically connected to a N-type semiconductor region through a second contact hole in the insulating layer.

6. The display device of claim 4, wherein
the semiconductor pattern includes N-type semiconductor regions formed at both ends and includes a P-type semiconductor region between the N-type semiconductor regions, and
each of the first photo electrode and the second photo electrode is electrically connected to each of the N-type semiconductor regions through a respective contact hole formed in the insulating layer.

7. The display device of claim 2, wherein
the photo sensor unit includes a photo detector that detects a current flowing between the first photo electrode and the second photo electrode when ambient light is incident upon the semiconductor pattern.

8. The display device of claim 7, wherein
a reverse bias voltage is applied to the second photo electrode, and the first photo electrode is connected to the photo detector.

9. The display device of claim 8, further comprising:
a current amplifier between the photo sensor unit and the photo detector.

10. The display device of claim 2, wherein
the touch electrodes, the first photo electrode, and the second photo electrode are simultaneously formed of the same material, and
the touch electrodes are insulated from the first photo electrode and the second photo electrode.

11. The display device of claim 2, wherein
the display region includes a light emission region overlapping a light emitting element in a thickness direction and a non-light emission region other than the light emission region,
the first photo electrode and the second photo electrode are formed in a mesh structure each including a body portion and a mesh hole, and
the body portions of each of the first photo electrode and the second photo electrode overlap the non-light emission region in the thickness direction.

12. The display device of claim 11, wherein
the semiconductor pattern overlaps the light emission region and the non-light emission region in the thickness direction.

13. The display device of claim 1, wherein
the photo sensor unit includes a first photo electrode, a second photo electrode, and a photoconductor, and the first photo electrode and the second photo electrode overlap the photoconductor in a thickness direction.

14. The display device of claim 13, wherein
the photoconductor is formed of any one of cadmium sulfide (CdS), lead sulfide (PdS), selenium (Se), zinc oxide (ZnO), and antimony trisulfide ($Sb_2S_3$).

15. The display device of claim 13, wherein
an insulating layer is interposed between at least one of the first photo electrode or the second photo electrode and the photoconductor.

16. The display device of claim 15, wherein
the first photo electrode is electrically connected to one side of the photoconductor through a first contact hole in the insulating layer, and
the second photo electrode is electrically connected to the other side of the photoconductor through a second contact hole in the insulating layer.

17. The display device of claim 13, wherein
the display region includes a light emission region overlapping a light emitting element in a thickness direction and a non-light emission region other than the light emission region,
the first photo electrode, the second photo electrode, and the photoconductor are formed in a mesh structure including a body portion and a mesh hole, and
the body portion of each of the first photo electrode, the second photo electrode, and the photoconductor overlaps the non-light emission region in the thickness direction.

18. The display device of claim 13, wherein
the touch electrodes, the first photo electrode, and the second photo electrodes are simultaneously formed of the same material, and
the touch electrodes are insulated from the first photo electrode and the second photo electrode.

19. The display device of claim 1, wherein
the display panel controls luminance by controlling the number of periods in which pixels are turned off by a light emission control signal during one frame.

20. The display device of claim 19, wherein
the display panel includes a panel driver,
the sensor unit includes a controller, and
the panel driver supplies a control signal to the controller to detect a current generated from the photo sensor unit exclusively during a period overlapping a period in which the pixels of the display panel are turned off.

* * * * *